(12) United States Patent
Sim et al.

(10) Patent No.: US 8,183,152 B2
(45) Date of Patent: May 22, 2012

(54) METHOD OF FABRICATING SEMICONDUCTOR DEVICE

(75) Inventors: Jae-Hwang Sim, Seoul (KR);
Yoon-Moon Park, Seoul (KR);
Keon-Soo Kim, Hwaseong-si (KR);
Min-Sung Song, Hwaseong-si (KR);
Young-Ho Lee, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 82 days.

(21) Appl. No.: 12/904,363

(22) Filed: Oct. 14, 2010

(65) Prior Publication Data

US 2011/0136340 A1     Jun. 9, 2011

(30) Foreign Application Priority Data

Dec. 8, 2009   (KR) .................. 10-2009-0121349

(51) Int. Cl.
*H01L 21/311* (2006.01)

(52) U.S. Cl. ........ 438/637; 438/671; 438/699; 438/947; 257/E21.235

(58) Field of Classification Search .................. 438/637, 438/671, 699, 947; 257/E21.235
See application file for complete search history.

(56) References Cited

U.S. PATENT DOCUMENTS

| | | | |
|---|---|---|---|
| 7,253,118 B2 | 8/2007 | Tran et al. | |
| 7,265,059 B2 * | 9/2007 | Rao et al. | 438/734 |
| 2007/0224823 A1 * | 9/2007 | Sandhu | 438/694 |
| 2007/0264830 A1 * | 11/2007 | Huang et al. | 438/694 |
| 2008/0085612 A1 * | 4/2008 | Smythe et al. | 438/787 |
| 2009/0075485 A1 | 3/2009 | Ban et al. | |
| 2010/0267237 A1 * | 10/2010 | Bonser et al. | 438/689 |
| 2010/0267238 A1 * | 10/2010 | Johnson et al. | 438/692 |

FOREIGN PATENT DOCUMENTS

| | | |
|---|---|---|
| JP | 2007-150166 | 6/2007 |
| JP | 2008536297 | 9/2008 |
| JP | 2009-076902 | 4/2009 |
| KR | 1020070116108 A | 12/2007 |
| KR | 1020090029521 A | 3/2009 |

* cited by examiner

*Primary Examiner* — George Fourson, III
(74) *Attorney, Agent, or Firm* — Volentine & Whitt, PLLC

(57) ABSTRACT

A method of fabricating a semiconductor device facilitates the forming of a conductive pattern of features having different widths. A conductive layer is formed on a substrate, and a mask layer is formed on the conductive layer. First spaced apart patterns are formed on the mask layer and a second pattern including first and second parallel portion is formed beside the first patterns on the mask layer. First auxiliary masks are formed over ends of the first patterns, respectively, and a second auxiliary mask is formed over the second pattern as spanning the first and second portions of the second pattern. The mask layer is then etched to form first mask patterns below the first patterns and a second mask pattern below the second pattern. The first and second patterns and the first and second auxiliary masks are removed. The conductive layer is then etched using the first and second mask patterns as an etch mask.

20 Claims, 37 Drawing Sheets

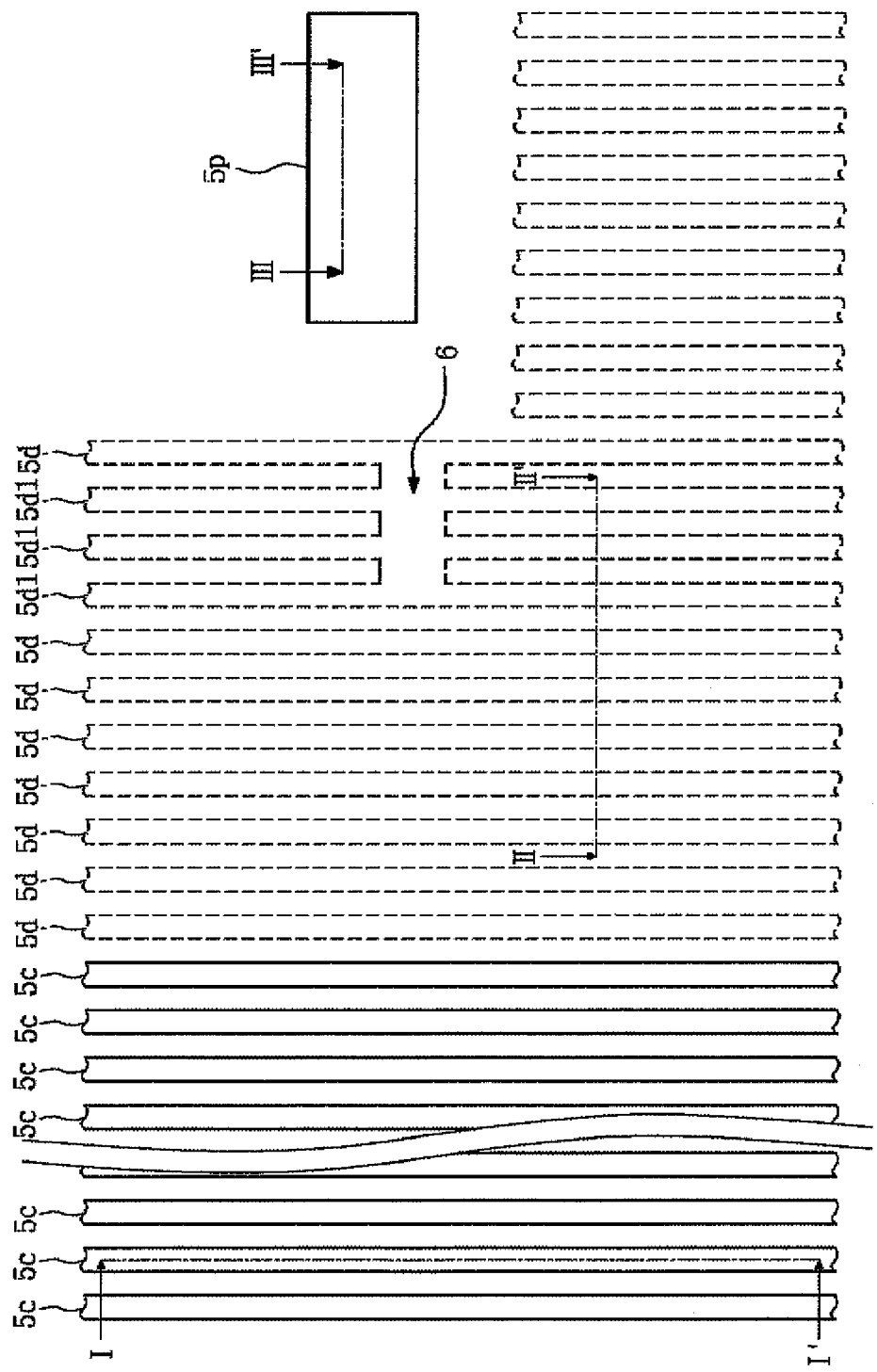

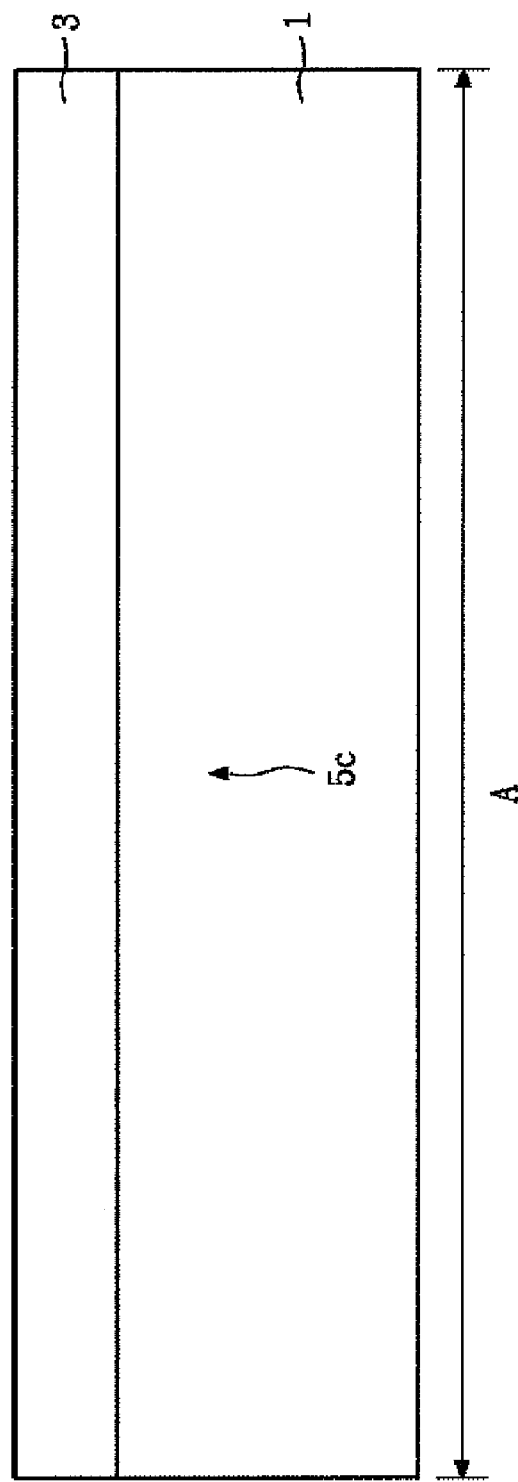

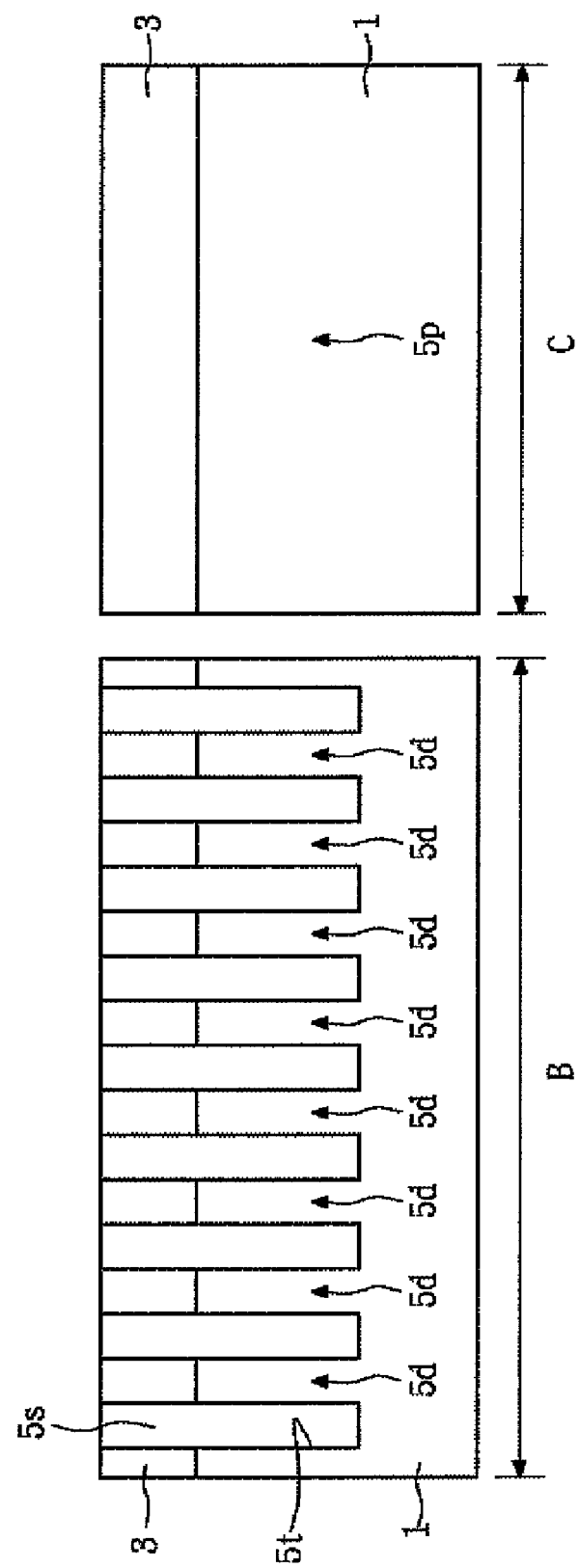

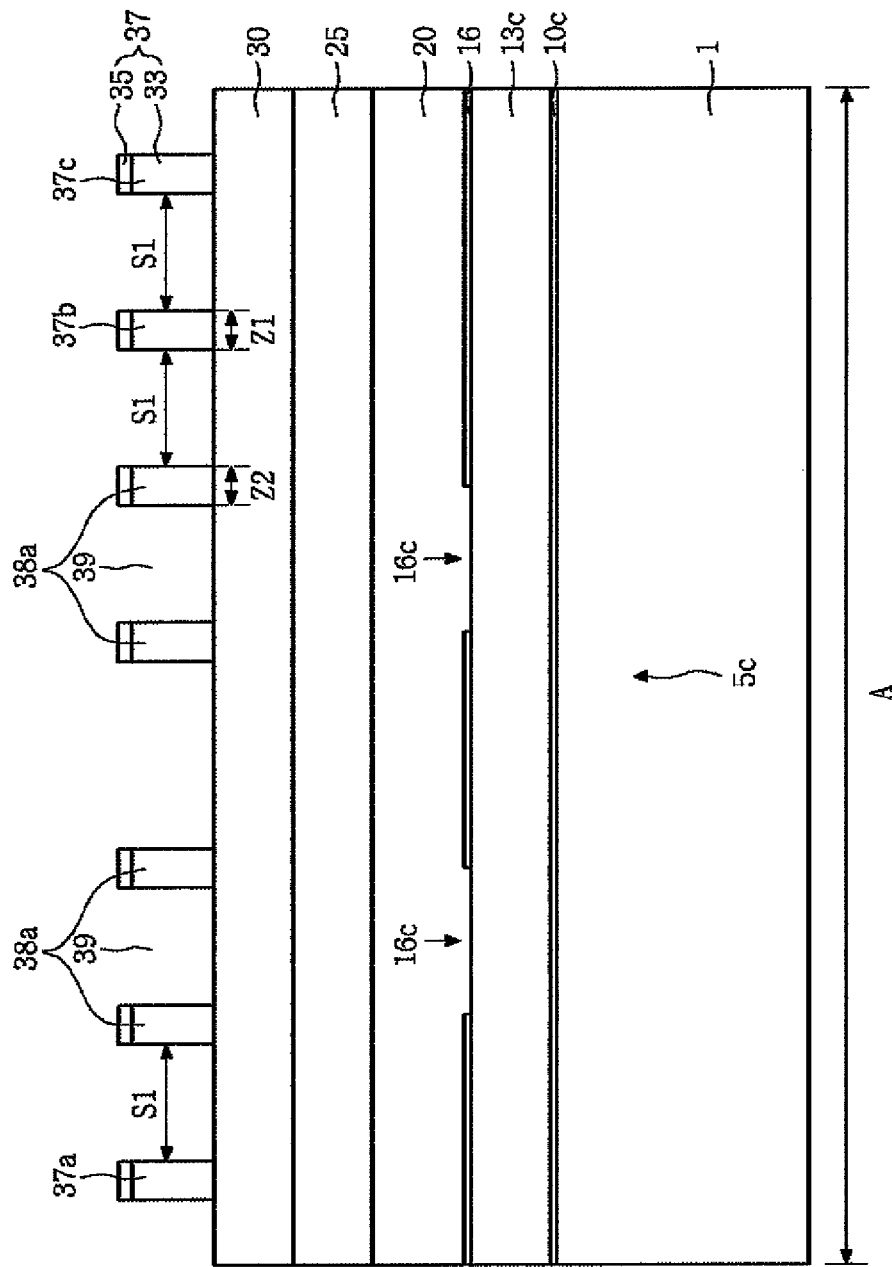

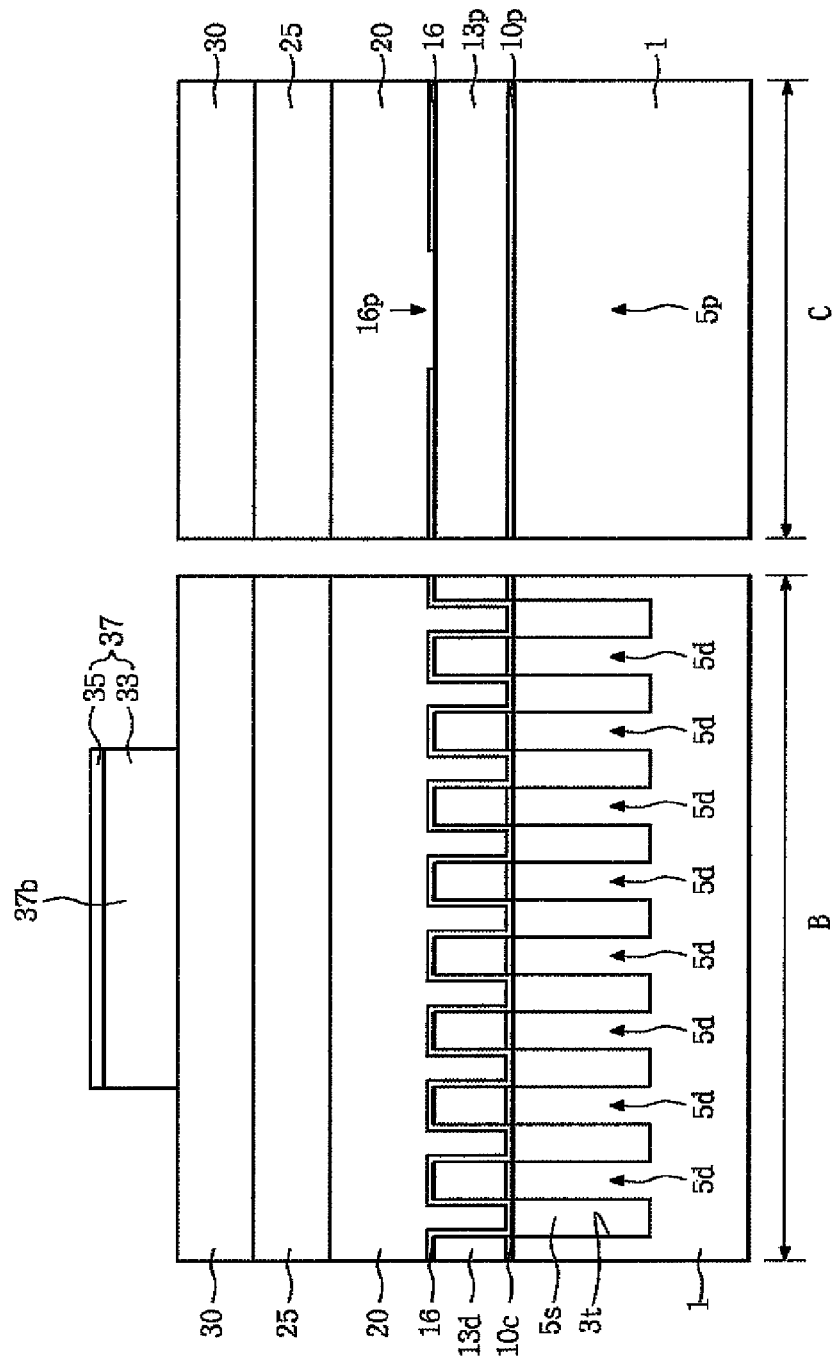

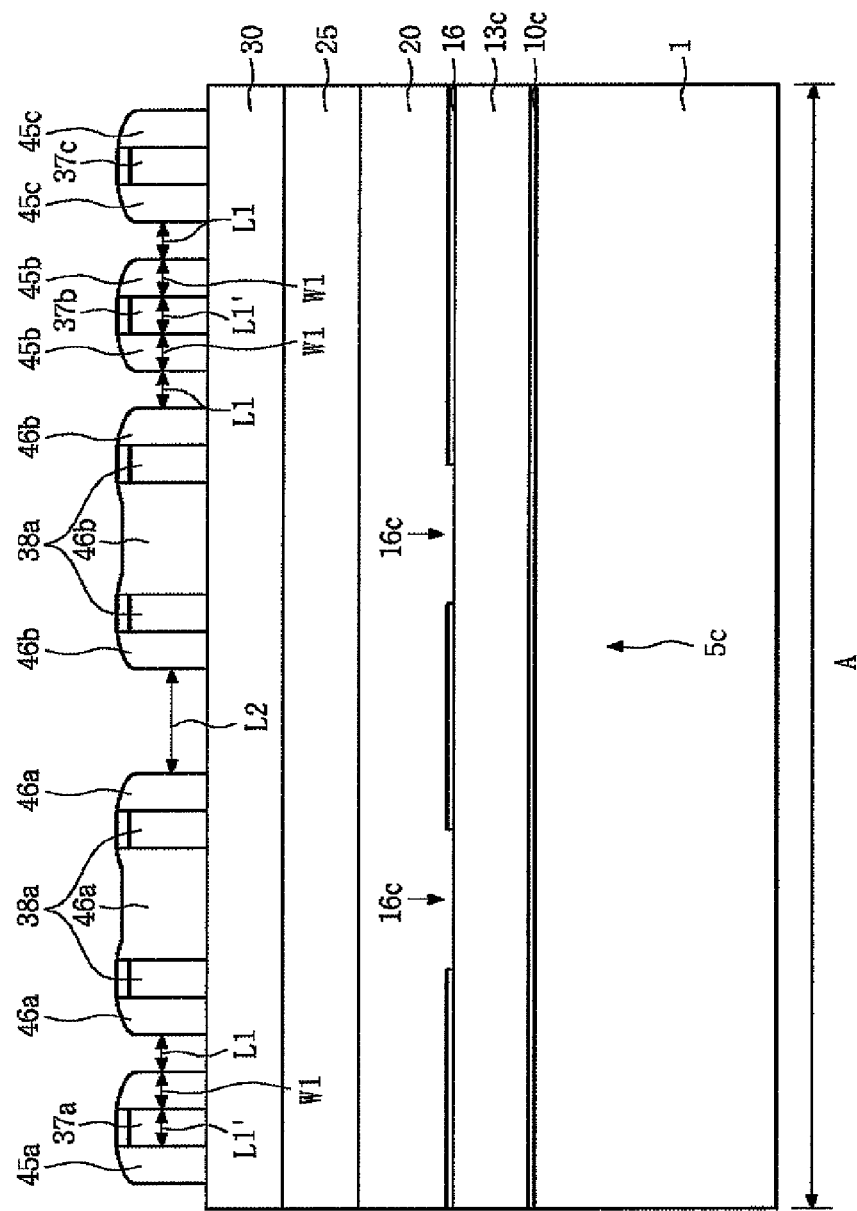

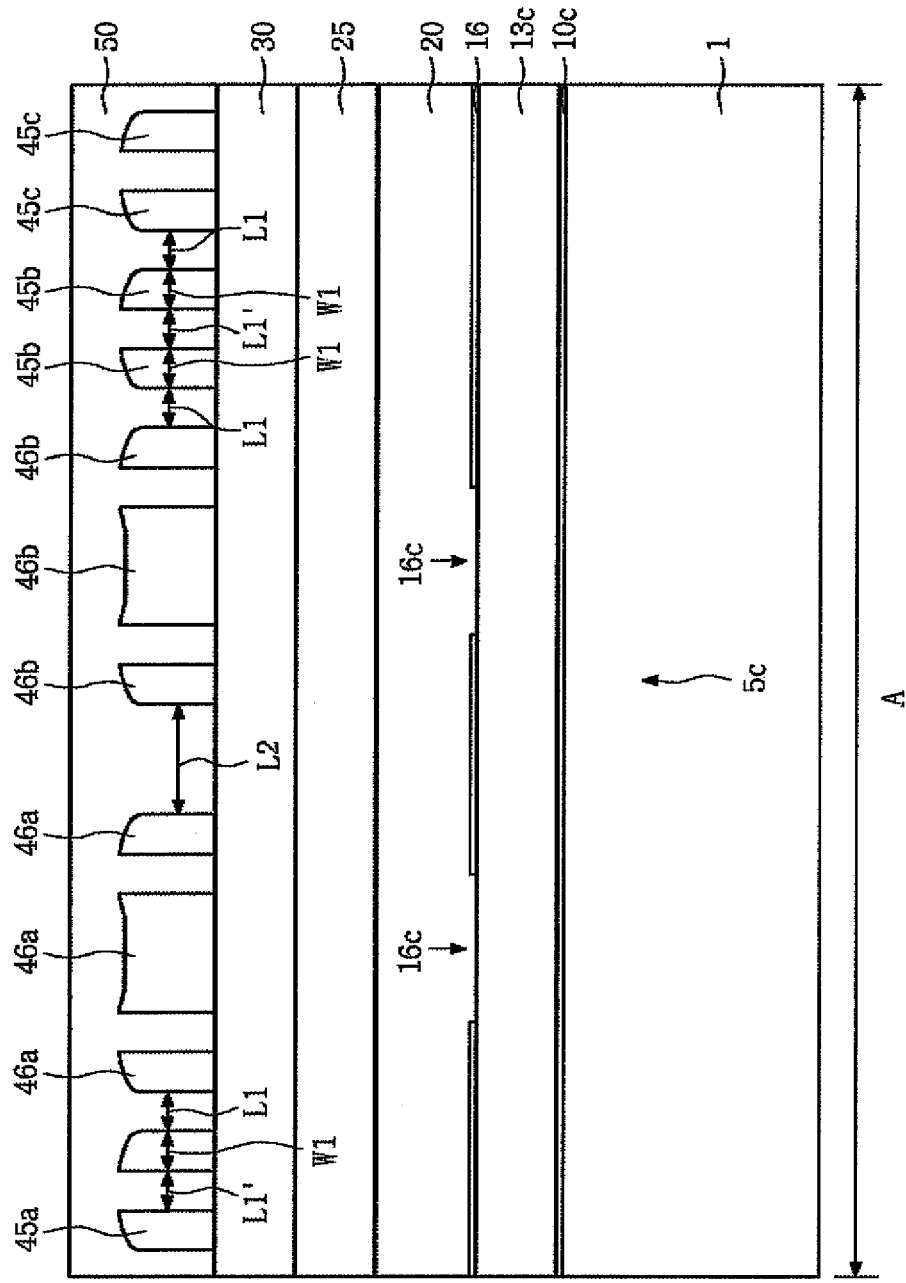

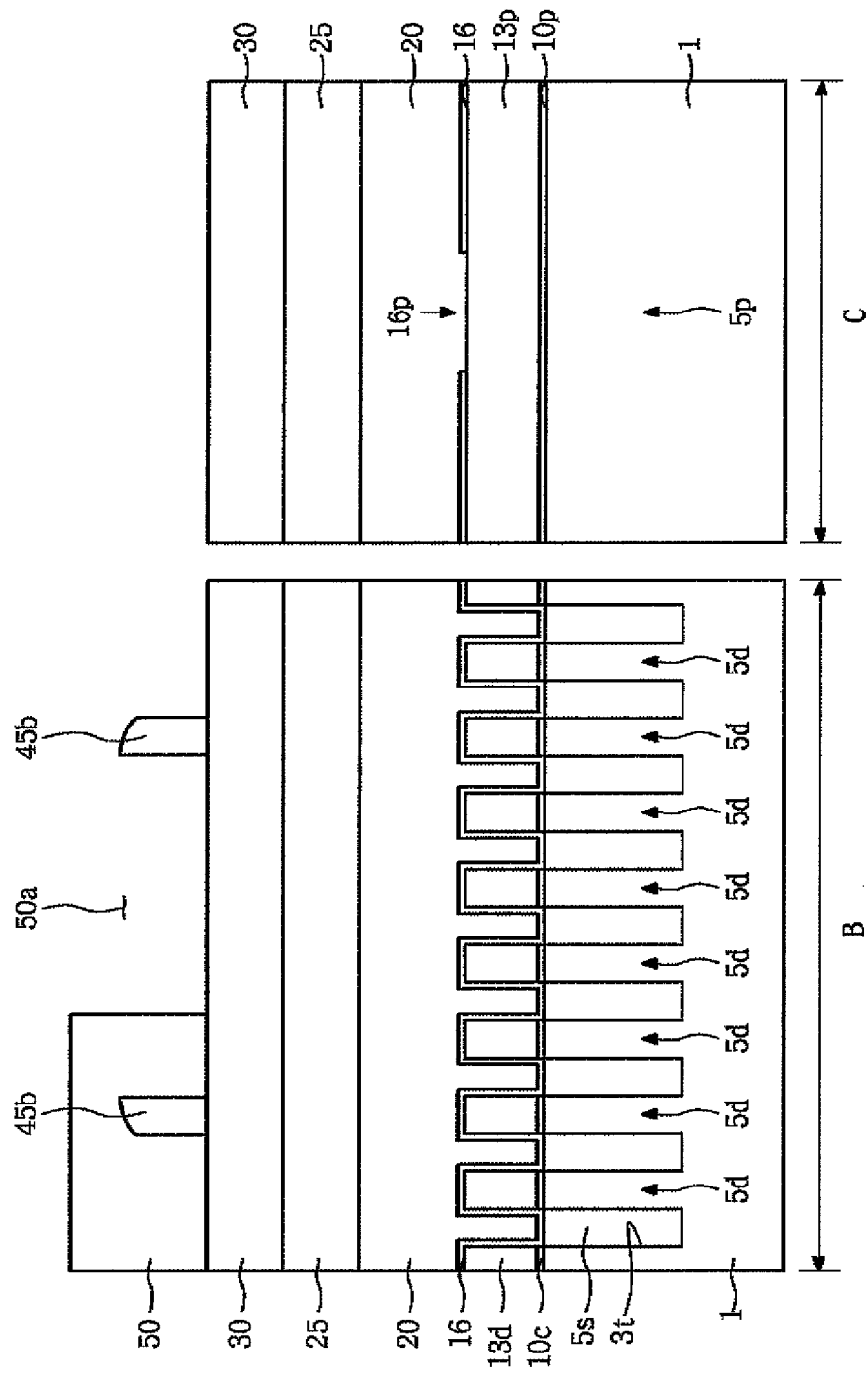

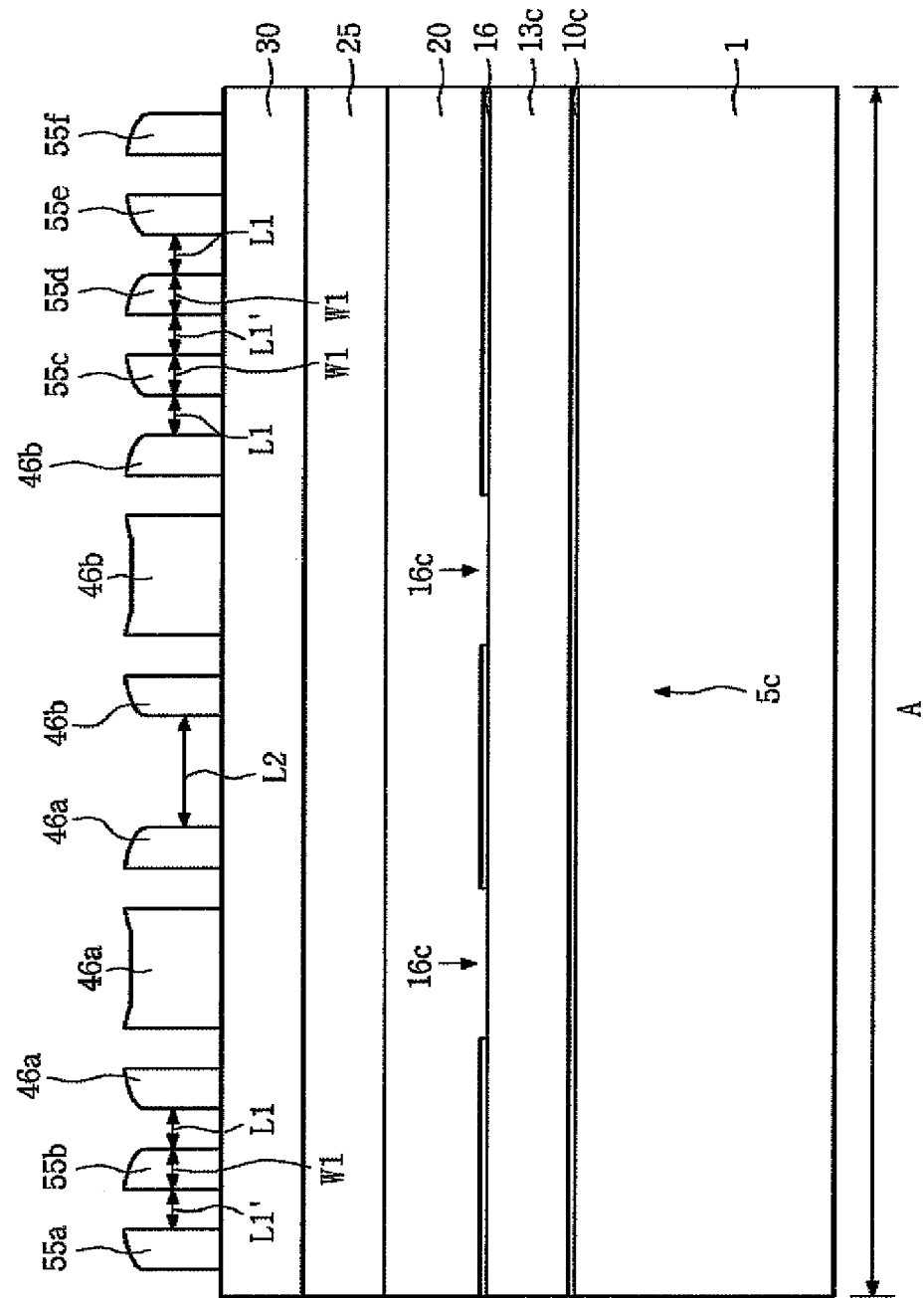

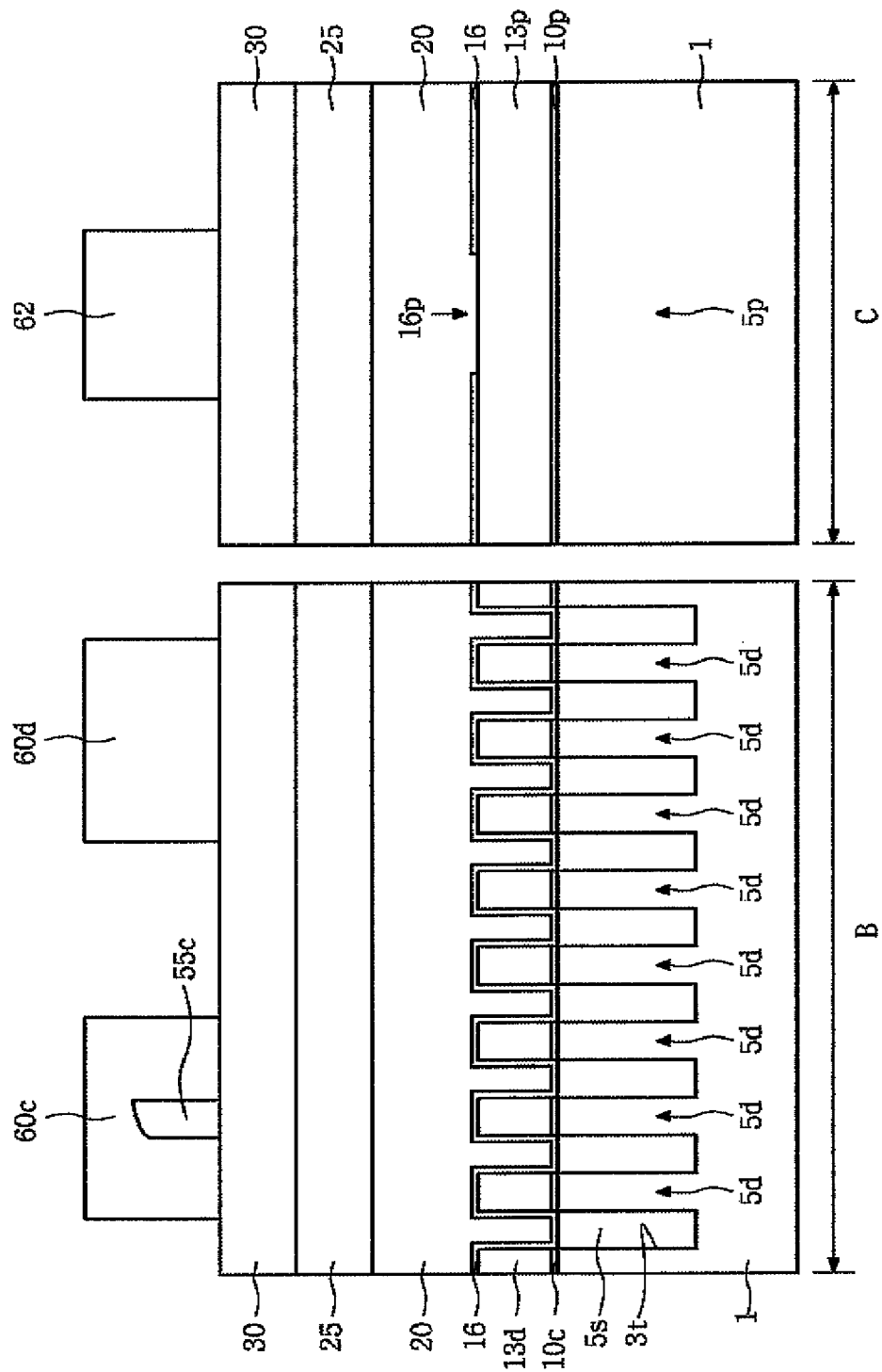

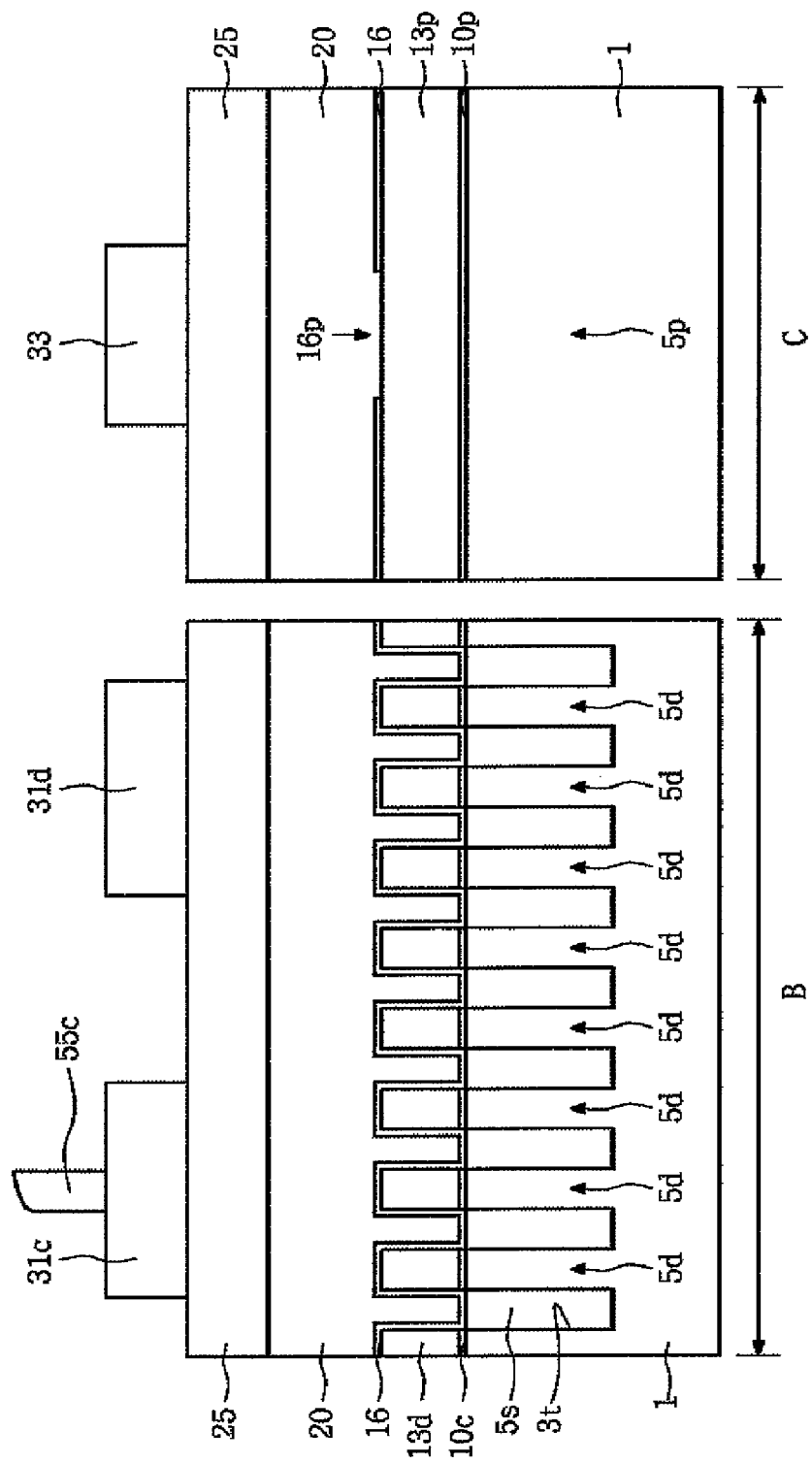

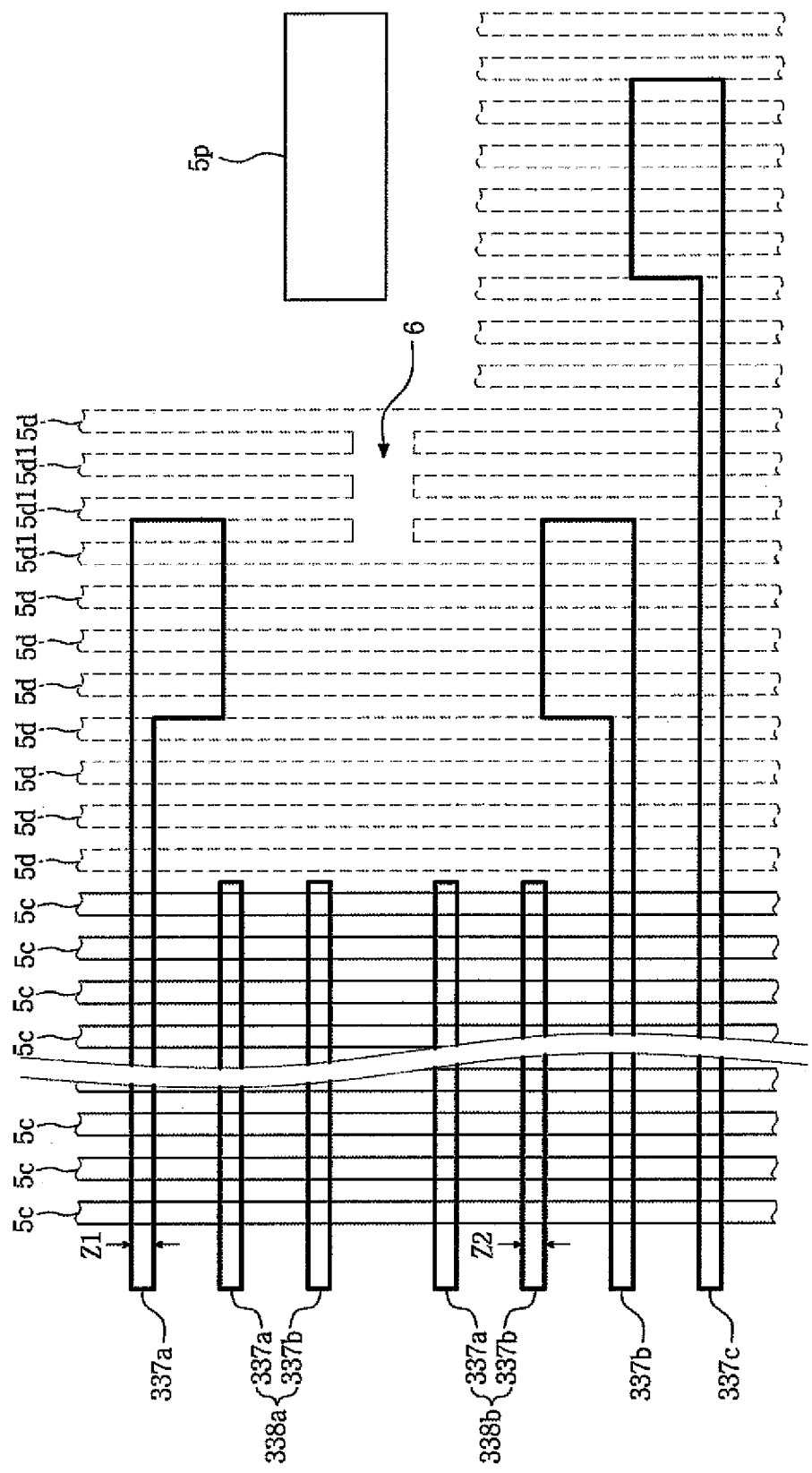

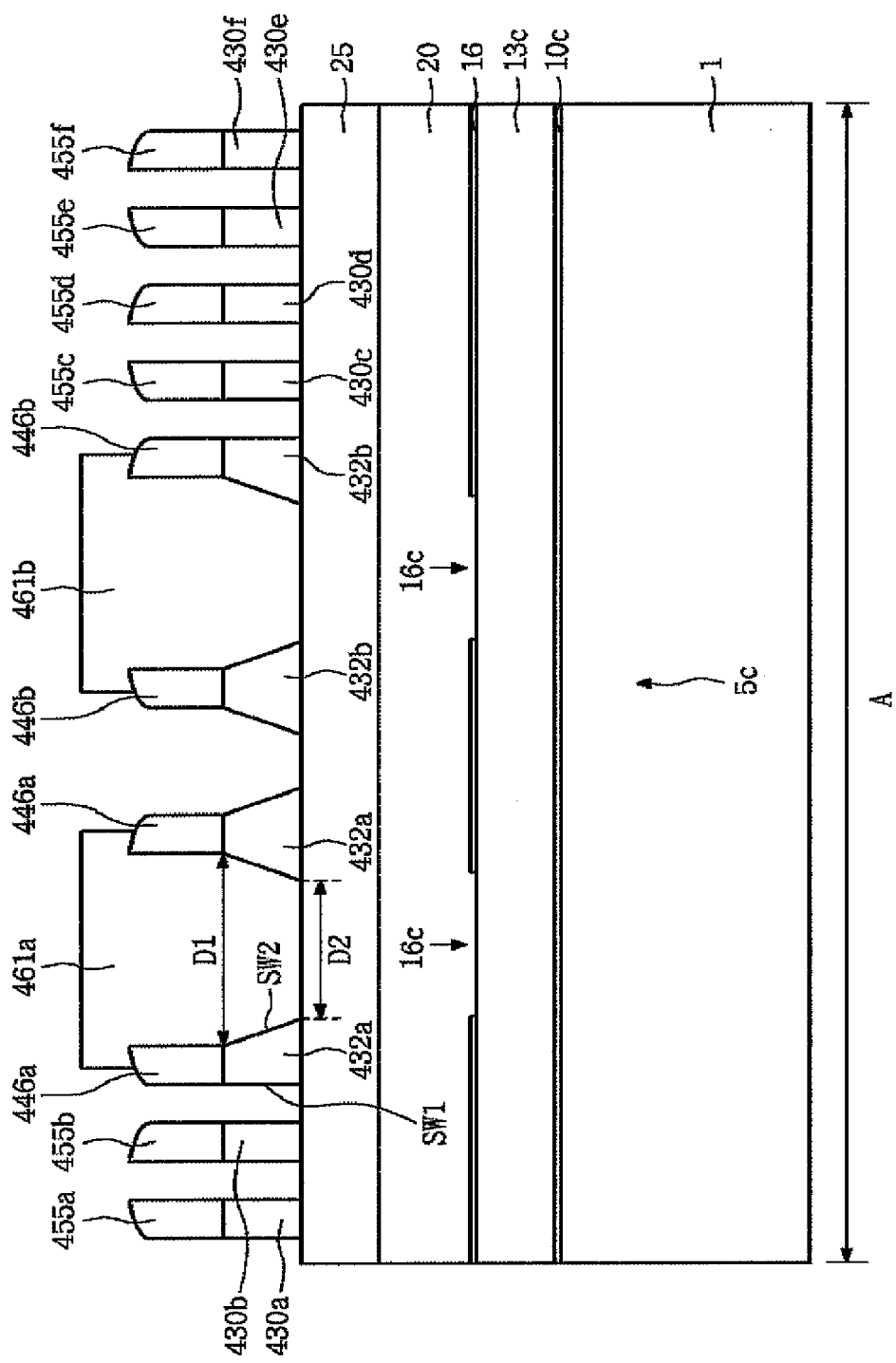

ved. Finally, the underlying layer is etched using the first and second mask patterns as an etch mask to thereby form first and second underlying patterns.

METHOD OF FABRICATING SEMICONDUCTOR DEVICE

PRIORITY STATEMENT

This application claims the benefit of priority under 35 U.S.C. §119 from Korean Patent Application No. 10-2009-0121349, filed on Dec. 8, 2009.

BACKGROUND

The inventive concept relates to semiconductor devices. More specifically, the inventive concept relates to a method of fabricating a semiconductor device having a pattern of features of different widths.

SUMMARY

According to one aspect of the inventive concept there is provided the following method of fabricating a semiconductor device. First, a conductive layer is formed on a substrate, a mask layer is formed on the conductive layer, and first patterns and a second pattern are formed on the mask layer, wherein the first patterns are spaced apart from each other and the second pattern includes first and second linear portions parallel to each other. Subsequently, first auxiliary masks are formed over ends of the first patterns, respectively, and a second auxiliary mask is formed over the second pattern as spanning the first and second portions of the second pattern. Thus, sidewalls of the second auxiliary mask are disposed on the first and second portions of the second pattern, respectively. The mask layer is etched using the first and second patterns and the first and second auxiliary masks as an etch mask to thereby form a first upper mask of first upper mask pattern features below the first patterns, respectively, and a second upper mask of a second upper mask pattern feature below the second pattern. The first and second patterns and the first and second auxiliary masks are removed. Finally, the conductive layer is etched using the first and second mask patterns as an etch mask to thereby form first conductive patterns below the first upper mask pattern features, respectively, and a second conductive pattern below the second upper mask pattern feature.

According to another aspect of the inventive concept, the following method of fabricating a semiconductor device is provided. An underlying layer is formed on a substrate. Then a mask layer and a sacrificial layer are sequentially formed on the underlying layer. The sacrificial layer is patterned to thereby form first sacrificial pattern features spaced apart from each other and at least one sacrificial pattern feature between two of the first sacrificial pattern features. Subsequently, first and second spacers are formed along sidewalls of the first and second sacrificial pattern features, respectively, so as to surround the first and second sacrificial pattern features. Then the first and second sacrificial pattern features are removed. Ends of the first spacers are also removed to thereby form spacer patterns spaced apart from each other. First auxiliary masks are formed over ends of the spacer patterns, respectively, and second auxiliary masks are formed over at least parts of each of the second spacers, respectively. The mask layer is etched using the spacer patterns, the second spacers and the first and second auxiliary masks as an etch mask to thereby form first mask pattern features below the spacer patterns, respectively, and second mask pattern features below the second spacers, respectively. The first and second auxiliary masks and the spacer patterns are removed. Finally, the underlying layer is etched using the first and second mask patterns as an etch mask to thereby form first and second underlying patterns.

According to still another aspect of the inventive concept, the following method of fabricating a semiconductor device is provided. First, an underlying layer is formed on a substrate. In turn, a first mask layer is formed on the underlying layer and a second mask layer is formed on the first mask layer. First spacer patterns spaced apart a first distance are formed on the second mask layer, and a second spacer pattern is formed as spaced apart by the first distance from adjacent ones of the first spacer patterns. The second spacer pattern has first and second portions parallel to each other. The second mask layer is then etched in such a way as to expose a predetermined region of the first mask layer to thereby form first upper mask pattern features below the first spacer patterns, and second upper mask pattern features below the second spacer pattern. In this process, a sidewall of each second upper mask pattern that faces away from the first upper mask pattern adjacent thereto is formed to be more inclined, with respect to the vertical, than sidewalls of the second upper mask pattern features which face toward first upper mask patterns. Also, the sidewall of each second upper mask pattern feature that faces toward the first upper mask patterns adjacent thereto is formed to have substantially the same gradient as the sidewalls of the first upper mask patterns. First auxiliary masks are then formed over ends of the first spacer patterns, respectively, and a second auxiliary mask is formed over the region of the first mask layer exposed between the first and second portions of the second spacer pattern. Subsequently, the first mask layer is etched using the first and second spacer patterns, the first and second upper mask pattern features, and the first and second auxiliary masks as an etch mask to thereby form lower mask pattern features. The first and second spacer patterns, and the first and second auxiliary masks are removed. Finally, the underlying layer is etched to thereby form underlying patterns. At this time, the first and second upper mask pattern features are removed.

BRIEF DESCRIPTION OF THE DRAWINGS

FIGS. 1A, 2A . . . 8A are plan views of a substrate during the course of a method of manufacturing a semiconductor device according to the inventive concept.

FIGS. 1B, 2B . . . 8B are sectional views taken along lines I-I' of FIGS. 1A, 2A . . . 8A, respectively.

FIGS. 1C, 2C . . . 8C are each a sectional view of respective regions of the substrate as taken along lines II-II' and III-III' respectively, of FIGS. 1A, 2A . . . 8A, respectively.

FIG. 12 is a plan view of still another form of a semiconductor device manufactured by a method in accordance with the inventive concept.

FIGS. 13B, 14B and 15B are sectional views of the substrate taken along lines IV-IV' of FIGS. 13A, 14A and 15A, respectively.

DETAILED DESCRIPTION OF THE PREFERRED EMBODIMENTS

Figure 2A:
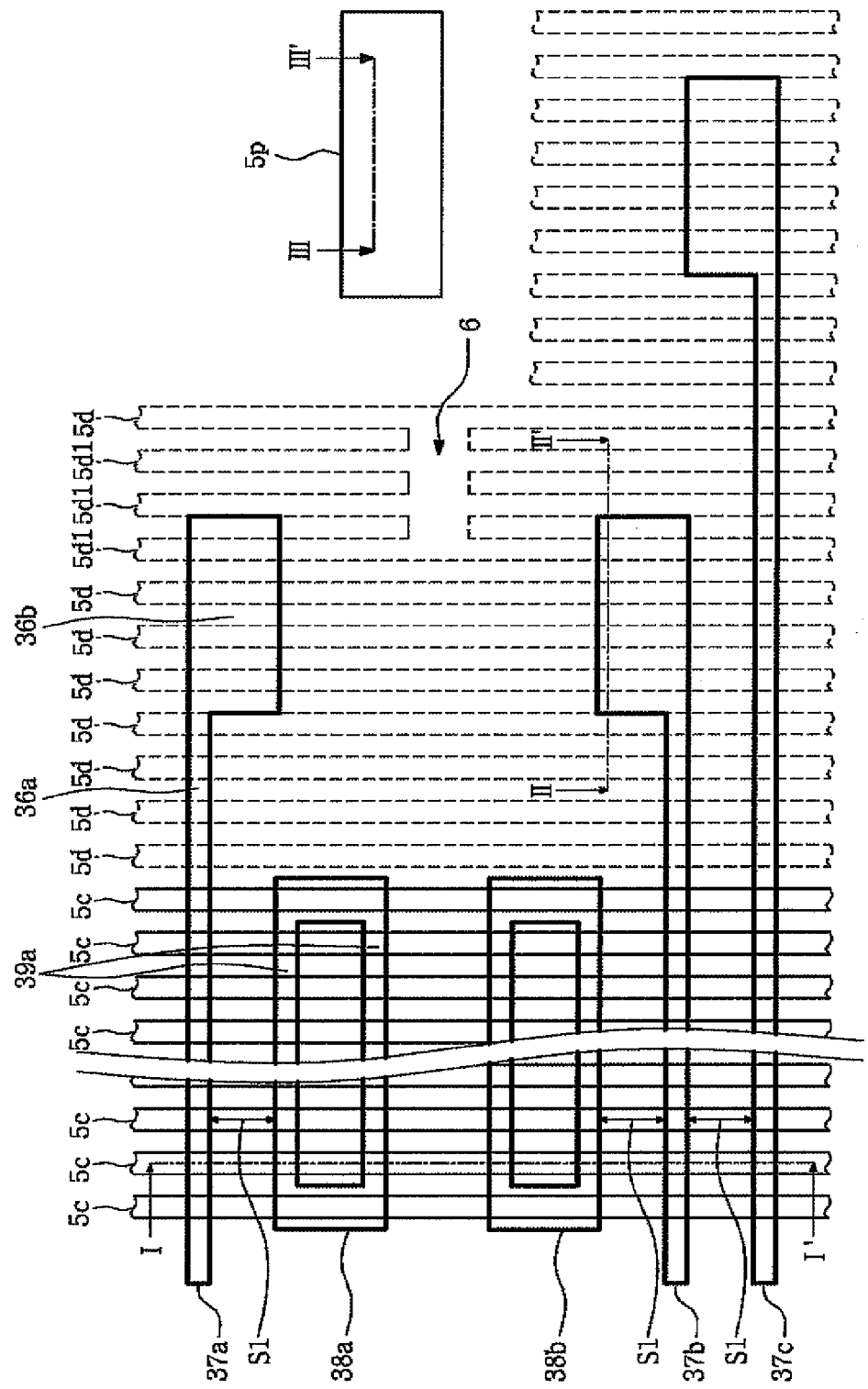

The inventive concept will now be described more fully with reference to the accompanying drawings. In the drawings, various aspects such as the thickness of layers and regions may be exaggerated for clarity. Furthermore, like reference numerals designate like elements throughout the drawings. Also, when a layer is described as being disposed or formed "on" another layer or a substrate, such a description may refer to either the case in which the layer in question is disposed or formed directly on the other layer or the substrate or the case in which an intervening layer(s) is/are interposed therebetween. Furthermore, the term "pattern" is used herein to describe a series of similar features formed from a layer by a patterning process such as a photolithography process. On the other hand, the term "patterns" or "pattern features" may be used to refer to the individual features of one such patterned layer or material. Likewise, the term "masks" or "mask features" may be used to refer to individual segments of a layer of material used together in a subsequent etching process to mask underlying structure. Also, the term "end" is generally used herein to refer to the end of a pattern/feature in the direction of the longest dimension thereof, i.e., in the longitudinal direction of the pattern/feature. Finally, the term "adjacent" used herein to describe certain patterns/features refers to those patterns/features which are closest to one another among a group of such patterns/features.

A method of fabricating one form of a semiconductor device according to the inventive concept will be described with reference to FIGS. 1A to 8C.

Referring first to FIGS. 1A, 1B, and 1C, a substrate 1 is prepared. The substrate 1 is a semiconductor substrate such as a bulk silicon substrate or a silicon on insulator (SOI) substrate on which a semiconductor integrated circuit can be formed.

An isolation mask 3 is formed on the substrate 1. The isolation mask 3 may include a pad oxide layer and a silicon nitride layer stacked on the pad oxide layer. In any case, the substrate 1 is etched using the isolation mask 3 as an etch mask to form a trench 5t defining a plurality of active regions. The active regions include first active regions 5c which together constitute a first device region (region where devices such as transistors are formed), and second active regions 5p which together constitute a second device region (another region where devices are formed). The first device region may be a cell array region of a semiconductor memory device, and the second device region may be a peripheral circuit region of the semiconductor memory device.

Furthermore, the trench 5t defines dummy active regions 5d which together constitute a field region where devices are not formed. That is, no devices such as transistors are formed on the dummy active regions 5d. Furthermore, some 5d1 of the dummy active regions 5d are connected to each other to form a body contact region 6 where a body bias is applied.

In the illustrated embodiment, each of the first active regions 5c is in the form of a line. Thus, each of the first active regions 5c may be a string active region.

Then, an isolation layer 5s is formed to fill the trench 5t. The isolation layer 5s is of an insulating material such as silicon oxide. For example, the isolation layer 5s may be formed by forming a layer of insulating material, such as a silicon oxide, on the substrate 1 to such a thickness as to overfill the trench 5t, and then planarizing the resulting layer of insulating material until the isolation mask 3 is exposed. In this case, the isolation layer 5s has a top surface disposed at a level above the active regions 5c, 5d and 5p. That is, the isolation layer 5s may have a portion that protrudes above the upper surfaces of the active regions 5c, 5d and 5p.

Referring to FIGS. 2A, 2B and 2C, the isolation mask (3 in FIGS. 1B and 1C) is removed so that the active regions 5c, 5d, and 5p are exposed. A first gate dielectric layer 10c is formed on the exposed first active regions 5c, and a second gate dielectric layer 10p is formed on the second active regions 5p. The first gate dielectric layer 10c may also be formed on the dummy active region 5d. Each of the first and second gate dielectric layers 10c and 10p may include at least one of a silicon oxide layer and a high-k dielectric layer. A high-k dielectric refers to a dielectric having a greater dielectric constant than that of silicon oxide. For example, the high-k dielectric layer may be an insulating metal oxide layer including hafnium or aluminum.

In some embodiments, the first and second gate dielectric layers 10c and 10p are formed of dielectrics having different thicknesses. For example, in one embodiment in which a low-voltage transistor is formed at the first active region 5c and a high-voltage transistor is formed at the second active region 5p, the second gate dielectric layer 10p is formed to be thicker than the first gate dielectric layer 10c.

In some embodiments, the first and second gate dielectric layers 10c and 10p are formed of the same dielectric. For example, in one embodiment in which a low-voltage transistor is formed at the first active region 5c and a low-voltage transistor is formed at the second active region, the first and second gate dielectric layers 10c and 10p are formed unitarily of the same material and to the same thickness.

A conductive material layer comprising polysilicon, for example, is then formed on the substrate having the first and second gate dielectric layers 10c and 10p. Afterwards, the conductive material layer is planarized until the isolation layer 5s is exposed, so that first conductive patterns 13c are formed on the first active region 5c, a second conductive pattern 13p is formed on the second active region 5p and a dummy conductive pattern 13d is formed on the dummy active region 5d. Therefore, the conductive patterns 13c, 13d and 13p are surrounded by the protruding portion of the isolation layer 5s.

In one embodiment in which the first active regions 5c are formed in the shape of lines, the first conductive patterns 13c are also formed in the shape of lines. Thus, the first active regions 5c may be used as string active regions in a cell array region of a flash memory device. In this case, the first conductive patterns 13c serve as floating gate lines.

In the present embodiment, at least a part of the protruding portion of the isolation layer 5s surrounding the conductive patterns 13c, 13d and 13p is etched. As a result, at least part of sidewalls of the conductive patterns 13c, 13d and 13p are exposed. More specifically, the isolation layer 5s may be etched until the upper surface of the isolation layer 5s arrives at the same level as the bottom surfaces of the conductive patterns 13c, 13d and 13p. Accordingly, the sidewalls of the conductive patterns 13c, 13d and 13p are exposed.

An inter-gate dielectric layer 16 is then formed on the conductive patterns 13c, 13d and 13p. The inter-gate dielectric layer 16 is a conformal layer having a substantially uniform thickness. Also, the inter-gate dielectric layer 16 may be formed of at least one of a silicon oxide layer and a high-k dielectric layer. For example, the inter-gate dielectric layer 16 may be formed of an oxide-nitride-oxide (ONO) layer or a high-k dielectric layer such as an insulating metal oxide layer including hafnium or aluminum.

In some embodiments, part of the inter-gate dielectric layer 16 is removed using photolithography to form first openings 16c exposing parts of the first conductive patterns 13c and a second opening 16p exposing at least part of the second conductive pattern 13p.

Afterwards, an underlying layer 20 is formed on the substrate. The underlying layer 20 may be formed of at least one of a silicon layer, a metal layer, a metal nitride layer and a metal-semiconductor compound layer. In the case in which the underlying layer 20 comprises a metal layer, the metal layer may be a layer of tungsten (W), titanium (Ti), or tantalum (Ta). In the case in which the underlying layer 20 comprises a metal nitride layer, the metal nitride layer may be a tungsten nitride layer, a titanium nitride layer, or a tantalum nitride layer. In the case in which the underlying layer 20 comprises a metal-semiconductor compound layer, the metal-semiconductor compound layer may be a tungsten silicide layer.

In the present embodiment, the underlying layer 20 is used to form a gate electrode. Therefore, the underlying layer will be referred to hereinafter as a gate conductive layer 20. The gate conductive layer 20 is electrically connected to the first and second conductive patterns 13c and 13p through the first and second openings 16c and 16p.

First and second mask layers 25 and 30 are then formed on the gate conductive layer 20. The first mask layer 25 is formed of an insulating material such as silicon oxide or silicon nitride. The second mask layer 30 is formed of material that is a different from that of the first mask layer 25. For example, the second mask layer 30 is formed of silicon when the first mask layer 25 is formed of silicon oxide or silicon nitride.

A sacrificial pattern 37 is then formed on the second mask layer 30. The sacrificial pattern 37 may include a first sacrificial layer 33 and a second sacrificial layer 35 formed (stacked) on the first sacrificial layer 33. In this case, the sacrificial layer 33 is preferably of a material having an etch selectivity with respect to the second mask layer 30. For example, when the second mask layer 30 is formed of a polysilicon layer, the first sacrificial layer 33 may be formed of a silicon oxide layer or an amorphous carbon layer. The second sacrificial layer 35 may be of material capable of functioning as an anti-reflective layer, e.g., silicon oxynitride (SiON).

Also, the first sacrificial layer 33 may be formed using a spin coating process. For example, the first sacrificial layer 33 may be formed by dispensing material in a liquid state onto the substrate, rotating the substrate to spread the material across the substrate, and curing the resulting coating of liquid material. After a layer of material constituting the second sacrificial layer pattern 35 is formed, the resulting layers are patterned to thereby form the sacrificial pattern 37, which serves as a mask.

The sacrificial pattern 37 includes first sacrificial pattern features 37a, 37b and 37c and one or more second sacrificial pattern features 38a and 38b disposed between two of the first sacrificial pattern features 37a, 37b and 37c (37a and 37b in the figures).

The first sacrificial pattern features that are adjacent to each other (37b and 37c in the figures) are spaced apart a first distance S1, and each second sacrificial pattern feature (38a and 38b in the figures) adjacent to a first sacrificial pattern feature (37a and 37b, respectively, in the figures) is spaced apart from that first sacrificial pattern feature by the same distance (first distance S1).

Furthermore, each of the first sacrificial pattern features 37a, 37b and 37c includes a first portion 36a in the form of a line, and a second portion 36b contiguous with one of the ends of the first portion 36a. The second portion 36b has a width greater than the width Z1 of the first portion 36a.

Each of the second sacrificial pattern features 38a and 38b includes linear segments or portions 39a (hereinafter referred to as line portions) spaced apart from each other. The line portions 39a are parallel to the first portions 36a of the first sacrificial pattern features 37a, 37b and 37c. Furthermore, each of the line portions 39a may have the same width Z2 as the widths Z1 of the first portions 36a of the first sacrificial pattern features 37a, 37b and 37c.

Furthermore, the line portions 39a of a second sacrificial pattern feature 38a, 38b may be connected to each other at one or both ends thereof. For example, as illustrated in FIG. 2A, the line portions 39a of second sacrificial pattern feature 38a are connected to each other at both ends thereof. Likewise, the line portions 39a of second sacrificial pattern feature 38a are connected to each other at both ends thereof. Therefore, each of the second sacrificial pattern features 38a and 38b has the form of a ring and, more specifically, is rectangular.

Each of the first sacrificial pattern features 37a, 37b and 37c crosses over the first active regions 5c, and may extend beyond the dummy active regions 5d. In addition, the second portion (wider end) 36b of each of the first sacrificial pattern features 37a, 37b and 37c is formed on the dummy active regions 5d.

In the present embodiment, as shown best in FIG. 2A, respective ends of the first sacrificial pattern features 37a, 37b and 37c are aligned, but the corresponding ends of the second sacrificial pattern features 38a and 38b are not aligned with those ends of the first sacrificial pattern features 37a, 37b and 37c. Even more so, neither of the ends of the second sacrificial pattern features 38a and 38b are aligned with either of the ends of the first sacrificial pattern features 37a, 37b and 37c. For example, the second sacrificial pattern features 38a and 38b are shorter than the first sacrificial pattern features 37a, 37b and 37c, and are formed so as to be situated between the first sacrificial pattern features 37a and 37b with respect to both the widthwise and longitudinal directions of the first sacrificial pattern features 37a and 37b.

Figure 3A:
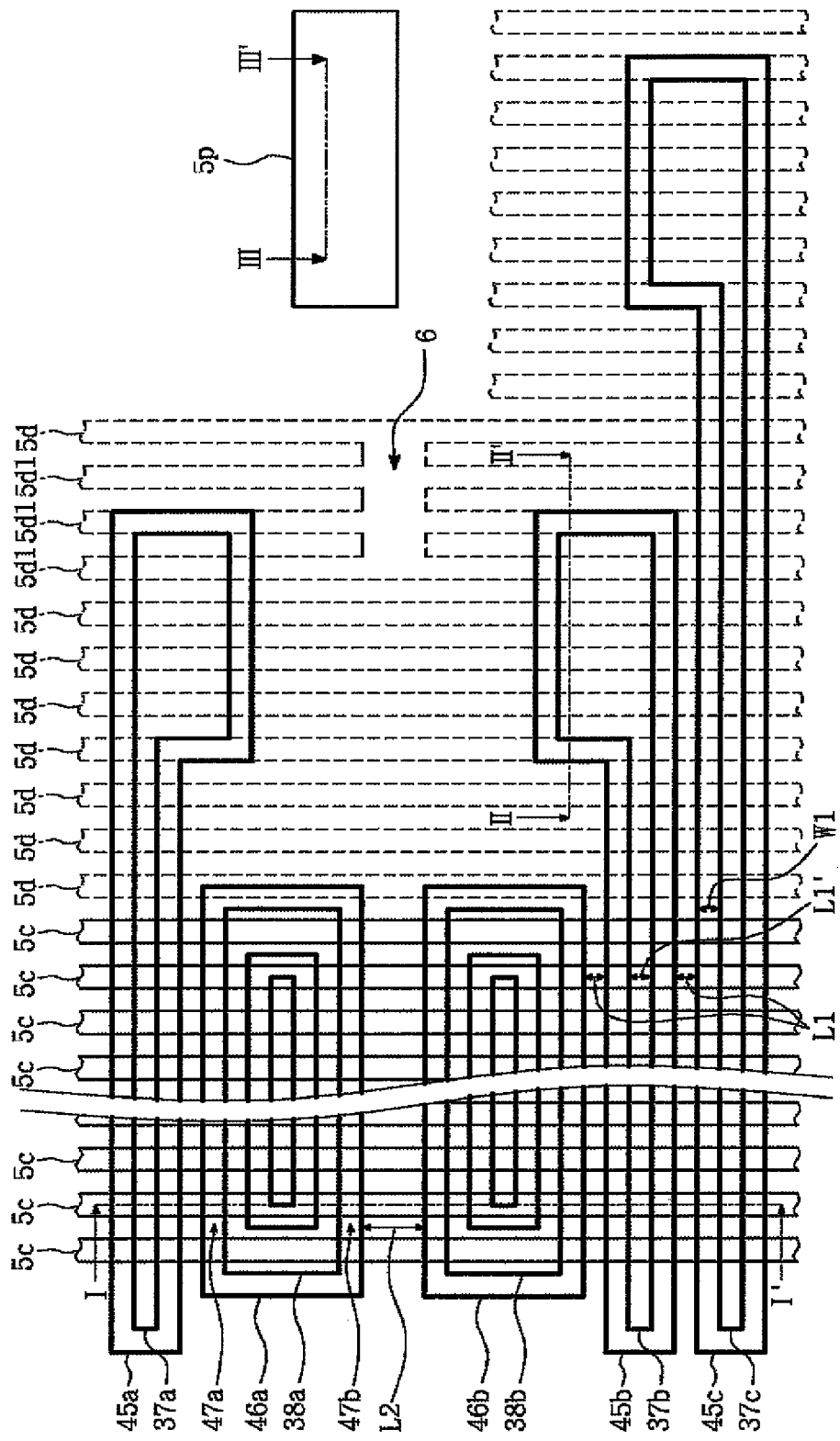
Figure 3C:
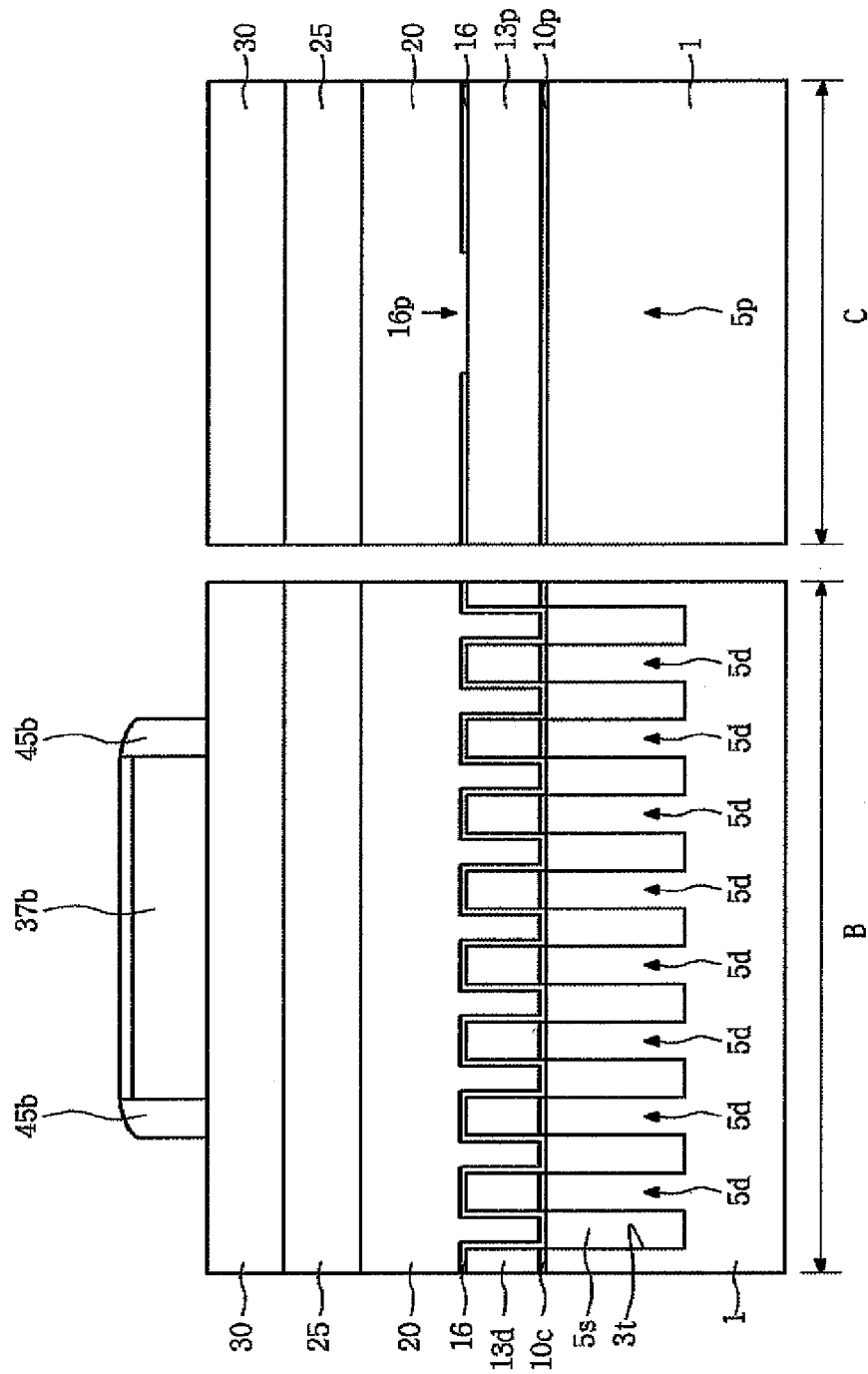

Referring to FIGS. 3A, 3B and 3C, a spacer layer is then formed on the substrate. The spacer layer may be formed to a uniform thickness. For example, the spacer layer may be formed using atomic layer deposition (ALD). Also, the spacer layer is preferably formed of a material having an etch selectivity with respect to the sacrificial pattern features 37a, 37b, 37c, 38a and 38b. For example, when the sacrificial pattern features 37a, 37b, 37c, 38a and 38b are formed of an amorphous carbon material, the spacer layer is formed of silicon oxide.

Then, the spacer layer is anisotropically etched to form spacers on sidewalls of the sacrificial pattern features 37a, 37b, 37c, 38a and 38b. The spacers thus include first spacers 45a, 45b and 45c on sidewalls of the first sacrificial pattern features 37a, 37b and 37c, respectively, and second spacers 46a and 46b on sidewalls of the second sacrificial pattern features 38a and 38b, respectively. Each of the first and second spacers 45a, 45b, 45c, 46a and 46b has the form of a ring.

Each of the second spacers 46a and 46b also includes a first portion 47a and a second portion 47b parallel to linear portions of the first spacers 45a, 45b and 45c.

Also, spacers having the following dimensional relationships can be readily formed when the spacer layer is formed using a deposition method, such as the ALD process mentioned above. This is because an ALD process allows the thickness of the layer to be easily controlled.

Specifically, each of the first and second spacers 45a, 45b, 45c, 46a and 46b may have the same width W1. Also, adjacent ones of the first spacers (spacers 45b and 45c in this embodiment) may be spaced apart a first distance L1, and the second spacers 46a and 46b may be spaced apart from the first spacers adjacent thereto (spacers 45a and 45b in this embodiment) by the same first distance L1. Furthermore, each of the first sacrificial pattern features 37a, 37b and 37c may have substantially the same width L1' as the first distance L1 on a region in which the first active regions 5c are disposed. The second spacers 46a and 46b may be spaced apart a second distance L2 greater than the first distance L1.

Figure 4A:
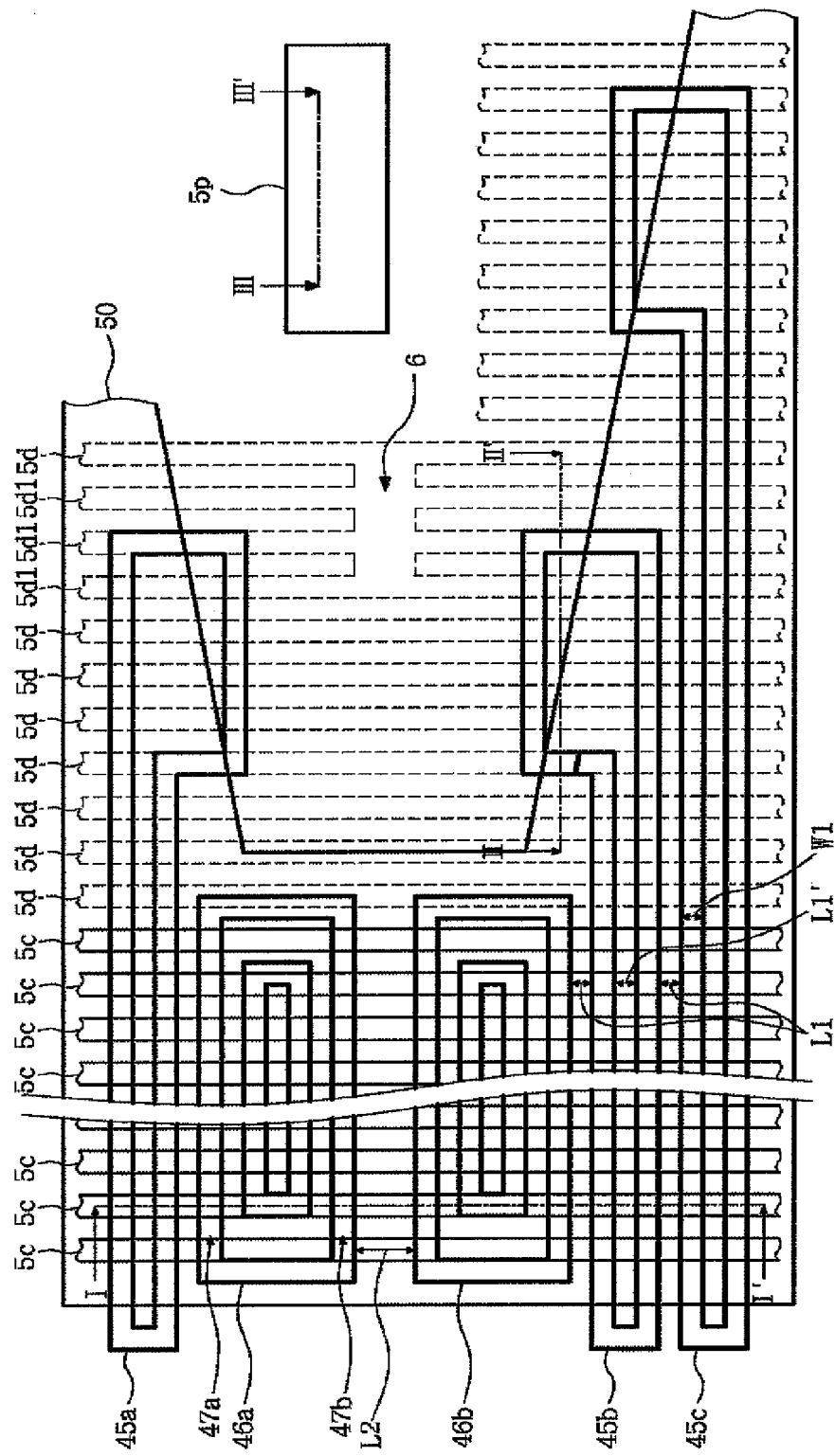

Referring to FIGS. 4A, 4B and 4C, the sacrificial pattern features 37a, 37b, 37c, 38a and 38b are selectively removed. Afterwards, a photoresist pattern 50 having an opening 50a exposing parts of the first spacers 45a, 45b and 45c is formed on the substrate. In some cases, the sacrificial pattern features 37a, 37b, 37c, 38a and 38b can be removed after the photoresist pattern 50 is formed. In any case, the photoresist pattern 50 covers the first and second spacers 45a, 45b, 45c, 46a and 46b, and exposes parts of the first spacers 45a, 45b and 45c. The parts of the first spacers 45a, 45b and 45c exposed by the opening 50a of the photoresist pattern 50 are the opposite ends of the first spacers 45a, 45b and 45c.

Figure 5A:
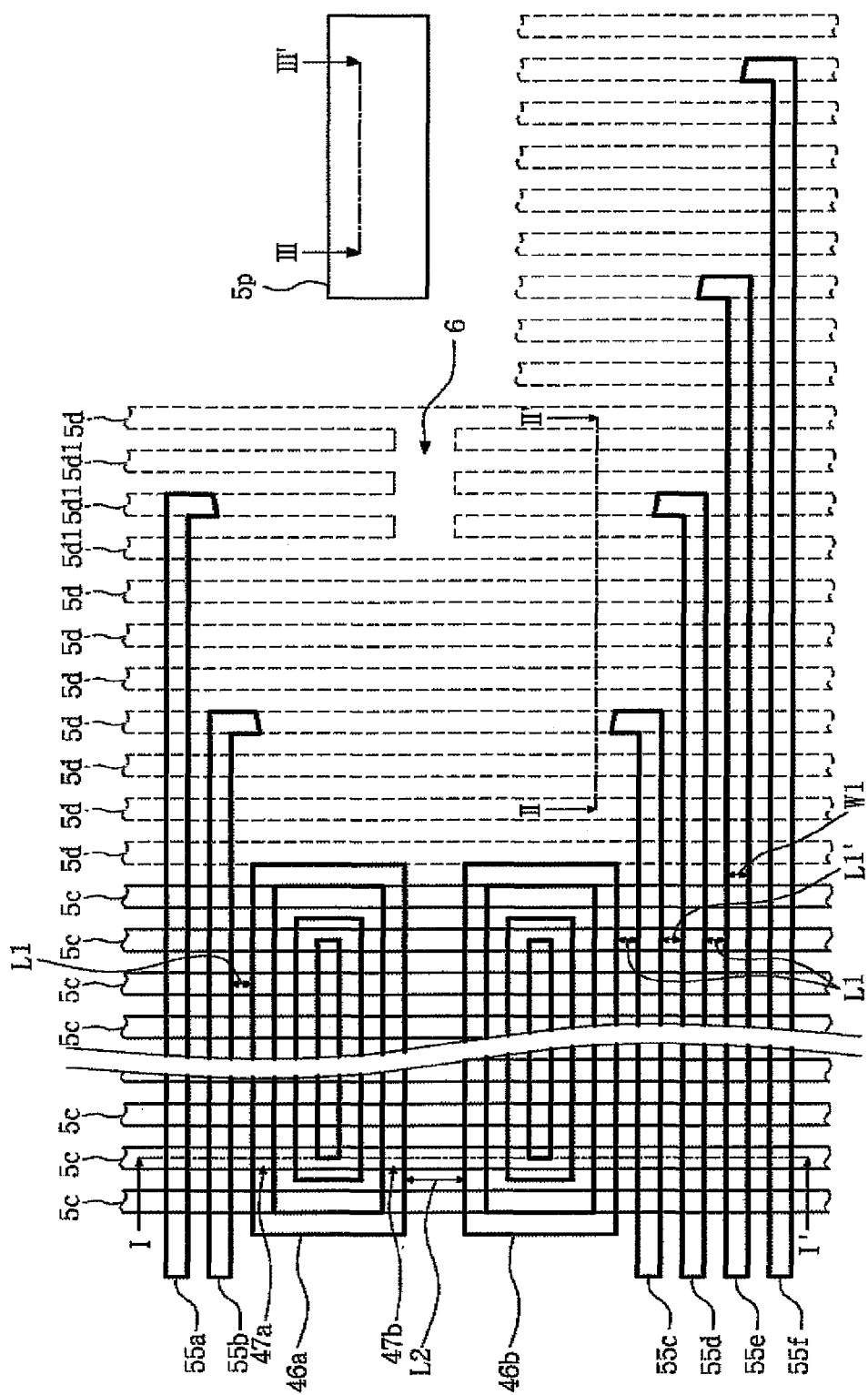
Figure 5C:
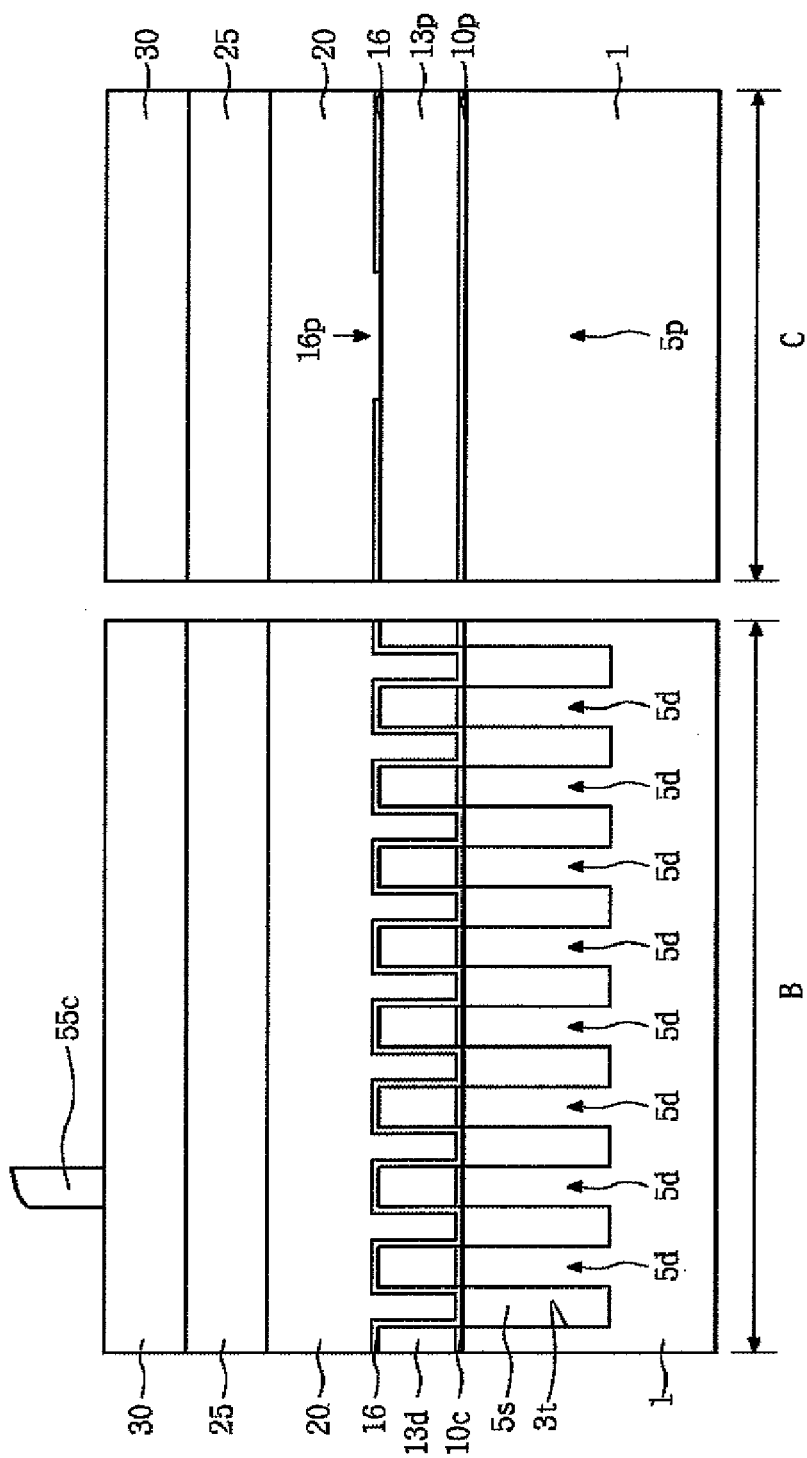

Referring to FIGS. 5A, 5B and 5C, the ends of the first spacers 45a, 45b and 45c exposed by the opening 50a are etched using the photoresist pattern 50 as an etch mask. As a result, the second spacers 46a and 46b remain as they were, and spacer patterns 55a, 55b, 55c, 55d, 55e and 55f spaced apart from each other are formed from the first spacers 45a, 45b and 45c. That is, each ring constituting a first spacer 45a, 45b and 45c is cut at both ends thereof to form two spacer patterns 55a and 55b spaced apart from each other.

The portions of the spacer patterns 55a, 55b, 55c, 55d, 55e and 55f which extend across the first active regions 5c are parallel to each other and have the same widths W1. Also, each of the respective ends of the spacer patterns 55a, 55b, 55c, 55d, 55e and 55f which are situated above a dummy active region 5d has a bent form. The form of the bend may be angular (as shown) or curved such that the distal portion of the spacer pattern 55a, 55b, 55c, 55d, 55e and 55f has an orientation (extends in a direction) different from that of the portion of the spacer pattern 55a, 55b, 55c, 55d, 55e and 55f which extends across the first active regions 5c. Furthermore, as in the illustrated embodiment, the ends of the spacer patterns 55a, 55b, 55c, 55d, 55e and 55f disposed above the dummy active regions 5d are bent towards a region in which the second spacers 46a and 46b are disposed.

Subsequently, the photoresist pattern 50 is removed.

Figure 6A:
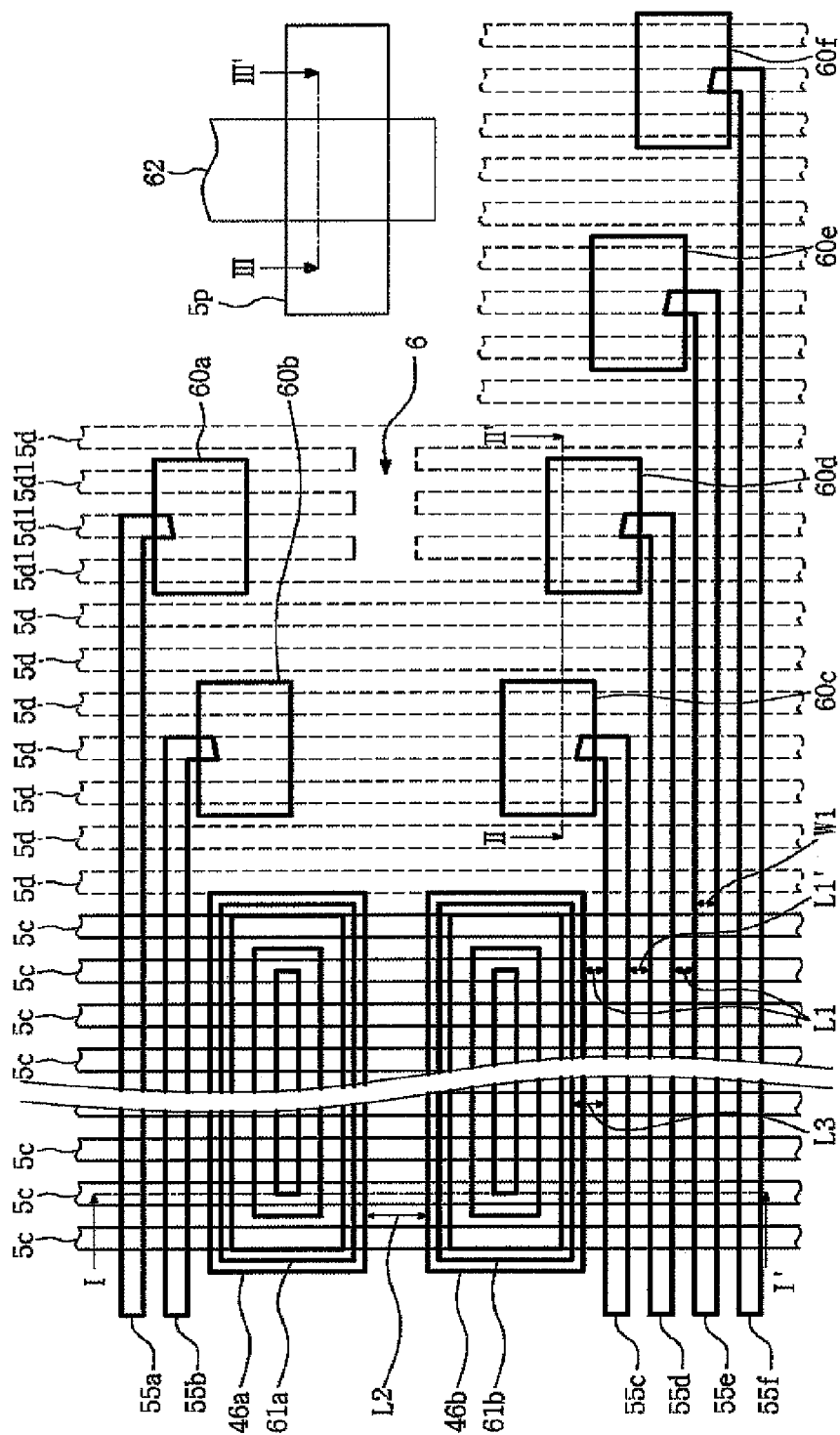
Figure 6B:
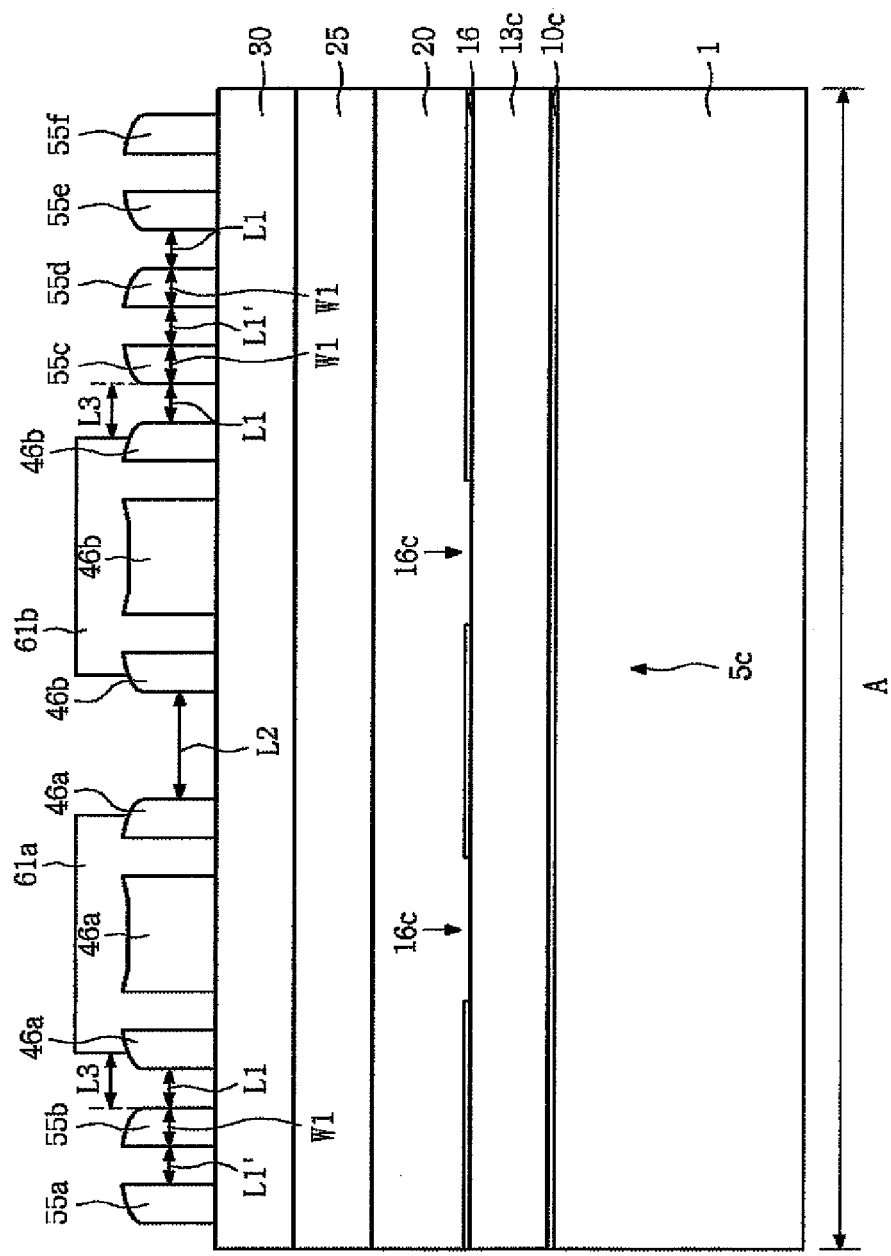

Referring to FIGS. 6A, 6B and 6C, an auxiliary mask layer is then formed on the substrate by, for example, spin coating. The auxiliary mask layer is preferably of material having an etch selectivity with respect to the spacer patterns 55a, 55b, 55c, 55d, 55e and 55f. For example, the auxiliary mask layer may be formed of an amorphous carbon layer when the spacer patterns 55a, 55b, 55c, 55d, 55e and 55f are formed of a silicon oxide layer. The auxiliary mask layer may be formed using a spin coating technique. The auxiliary mask layer is then patterned using photolithography to form auxiliary masks 60a, 60b, 60c, 60d, 60e, 60f, 61a and 61b and a peripheral sacrificial mask 62.

More specifically, the auxiliary masks include first auxiliary masks 60a, 60b, 60c, 60d, 60e and 60f overlapping the above-mentioned distal ends of the spacer patterns 55a, 55b, 55c, 55d, 55e and 55f, and second auxiliary masks 61a and 61b overlapping portions of the second spacers 46a and 46b, respectively. The first auxiliary masks 60a, 60b, 60c, 60d, 60e, 60f, 61a and 61b are thus formed over the dummy active regions 5d. Each of the second auxiliary masks 61a and 61b may be formed in the shape of a solid line.

In the present embodiment, as is clear from the description so far, each of the second spacers 46a and 46b includes a first portion 47a and a second portion 47b parallel to the spacer patterns 55a, 55b, 55c, 55d, 55e and 55f. Referring again to FIGS. 6A and 6B, each of the second auxiliary masks 61a and 61b spans the first and second portions 47a and 47b of a respective one of the second spacers 46a and 46b. The sidewalls of each of the second auxiliary masks 61a and 61b are thus disposed on the first and second portions 47a and 47b, respectively, of one of the second spacers 46a and 46b. Therefore, the forming of the second auxiliary masks 61a and 61b has a process margin as great as half the thickness of the spacer layer from which the second spacers 46a and 46b were formed. That is, the sidewalls of the second auxiliary masks 61a and 61b facing the first spacer patterns 55b and 55c adjacent to the second spacers 46a and 46b, respectively, overlap the second spacers 46a and 46b, respectively. Alternatively, the sidewalls of the second auxiliary mask 61a may be disposed between the first and second portions 47a and 47b of the second spacer 46a and similarly, the second auxiliary mask 61b may be disposed between the first and second portions 47a and 47b of the second spacer 46a and 46b.

Referring to FIG. 6B, in the present embodiment, the first spacer patterns 55b and 55c adjacent to the second spacers 46a and 46b are spaced apart from the second spacers 46a and 46b, respectively, each by a first distance L1. The sidewalls of the second auxiliary masks 61a and 61b closest to the first spacer patterns 55b and 55c, respectively, are spaced apart from the first spacer patterns 55b and 55c, respectively, each by a distance L3 equal to or greater than the first distance L1.

The peripheral sacrificial mask 62 may be formed to cross over the second active region 5p and extend beyond the isolation region 5s. In this respect, the peripheral sacrificial mask 62 may be used as a basic mask for forming a gate electrode of a transistor in a peripheral circuit region. However, the peripheral sacrificial mask 62 is not limited to use in the forming of a gate electrode. Alternatively, and for example, the peripheral sacrificial mask 62 may be used as a basic mask for forming an alignment key (for use in a photolithography process) or for forming devices such as a resistor, a capacitor electrode, etc. in the peripheral circuit region.

Figure 7A:
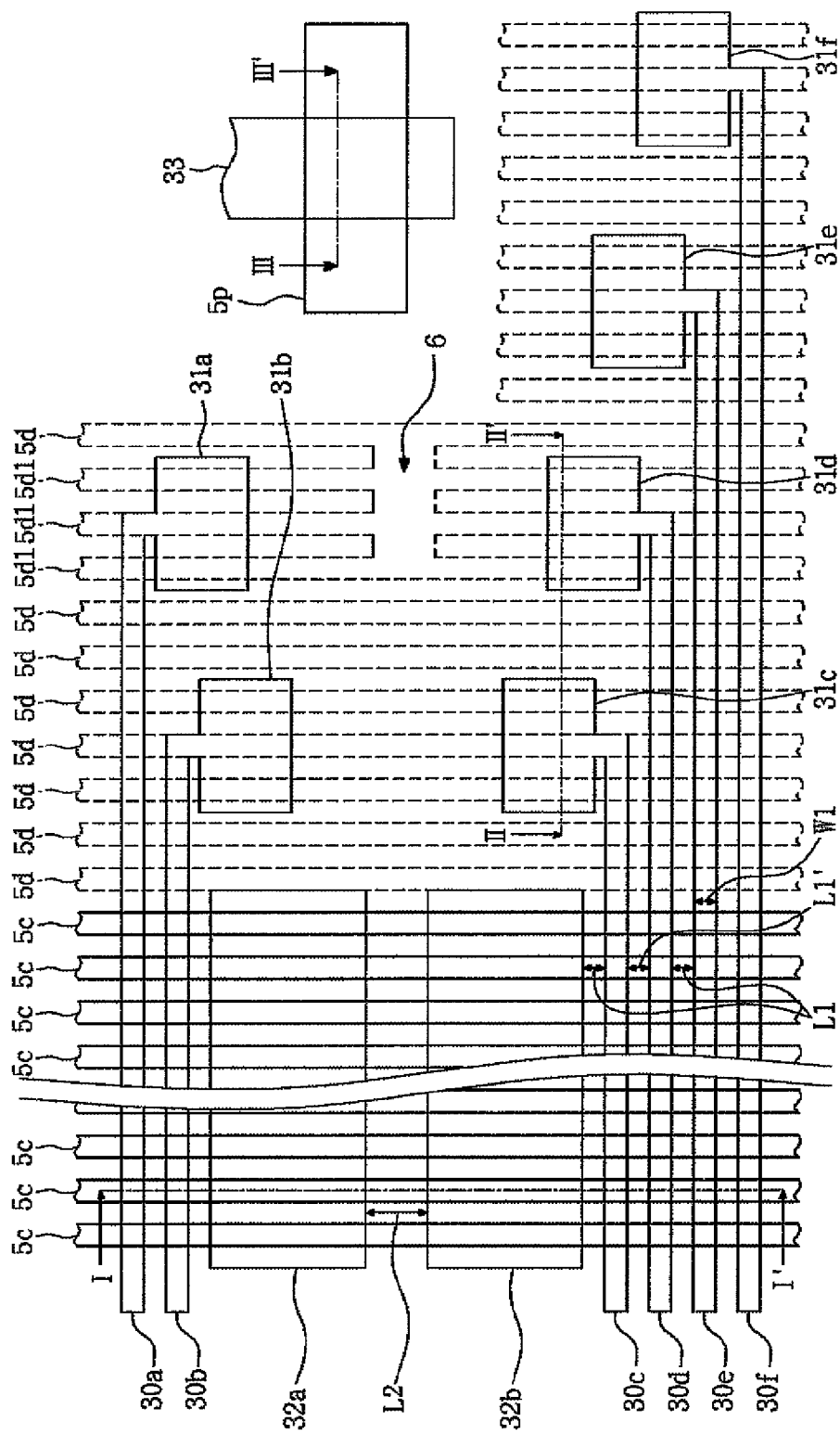
Figure 7B:
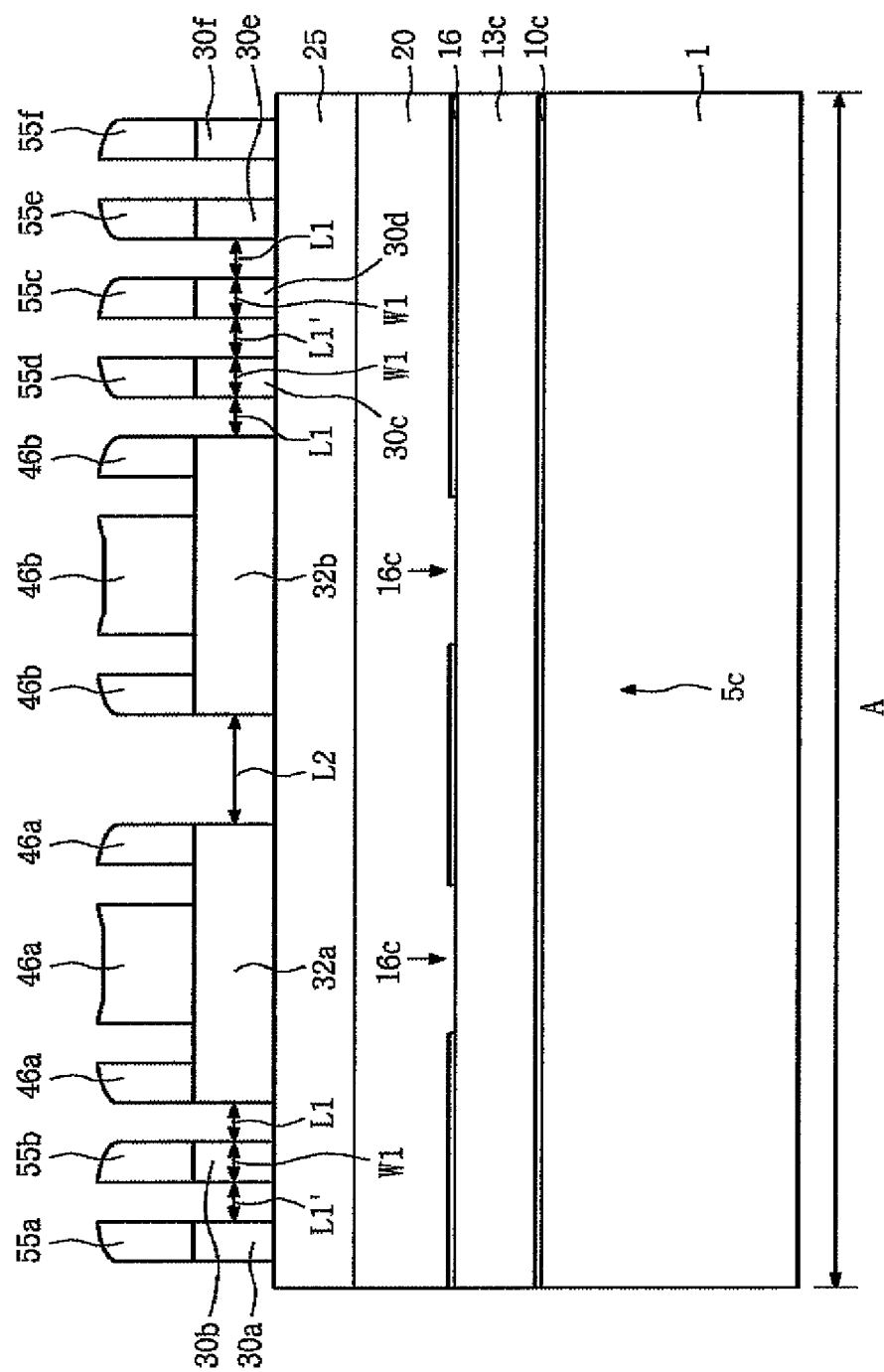

Referring to FIGS. 7A, 7B and 7C, the second mask layer 30 is anisotropically etched using the auxiliary masks 60a, 60b, 60c, 60d, 60e, 60f, 61a and 61b, the peripheral sacrificial mask 62, the spacer patterns 55a, 55b, 55c, 55d, 55e and 55f and the second spacers 46a and 46b as an etch mask. As a result, first upper mask pattern features 30a, 30b, 30c, 30d, 30e and 30f are formed below the spacer patterns 55a, 55b, 55c, 55d, 55e and 55f and the first auxiliary masks 60a, 60b, 60c, 60d, 60e and 60f, second upper mask pattern features 32a and 32b are formed below the second spacers 46a and 46b and the second auxiliary masks 61a and 61b, and a peripheral upper mask pattern feature 33 is formed below the peripheral sacrificial mask 62. The portions of the first upper mask pattern features 30a, 30b, 30c, 30d, 30e and 30f formed below the first auxiliary masks 60a, 60b, 60c, 60d, 60e and 60f are pad regions 31a, 31b, 31c, 31d, 31e and 31f, respectively.

In the present embodiment, the first upper mask pattern features 30a, 30b, 30c, 30d, 30e and 30f, the second upper mask pattern features 32a and 32b and the peripheral upper mask pattern feature 33 each have substantially vertical sidewalls. Therefore, the adjacent ones of first upper mask pattern features 30a, 30b, 30c, 30d, 30e and 30f are spaced apart from each other at regular intervals L1 and L1' above the first active regions 5c.

Also, above the first active regions 5c, the first upper mask pattern features 30b and 30c are spaced from the second upper mask pattern features 32a and 32b adjacent thereto, respectively, each by the distance L1. That is, above the first active regions 5c, the distance L1 between each of the first upper mask pattern features 30b and 30c and the second upper mask pattern features 32a and 32b adjacent thereto is substantially the same as the distances L1 and L1' between adjacent ones of the first upper mask pattern features 30a, 30b, 30c, 30d, 30e and 30f.

In this process, the auxiliary masks 60a, 60b, 60c, 60d, 60e, 60f, 61a and 61b and the peripheral sacrificial mask 62 may be removed while the second mask layer 30 is etched. However, the auxiliary masks 60a, 60b, 60c, 60d, 60e, 60f, 61a and 61b and the peripheral sacrificial mask 62 may be removed after the second mask layer 30 has been etched, i.e., after the first upper mask pattern features 30a, 30b, 30c, 30d, 30e and 30f, the second upper mask pattern features 32a and 32b and the peripheral upper mask pattern feature 33 have been formed. For example, the auxiliary masks 60a, 60b, 60c, 60d, 60e, 60f, 61a and 61b and the peripheral sacrificial mask 62 may be removed using an ashing process when the auxiliary masks 60a, 60b, 60c, 60d, 60e, 60f, 61a and 61b and the peripheral sacrificial mask 62 are formed of an amorphous carbon layer.

Figure 8A:
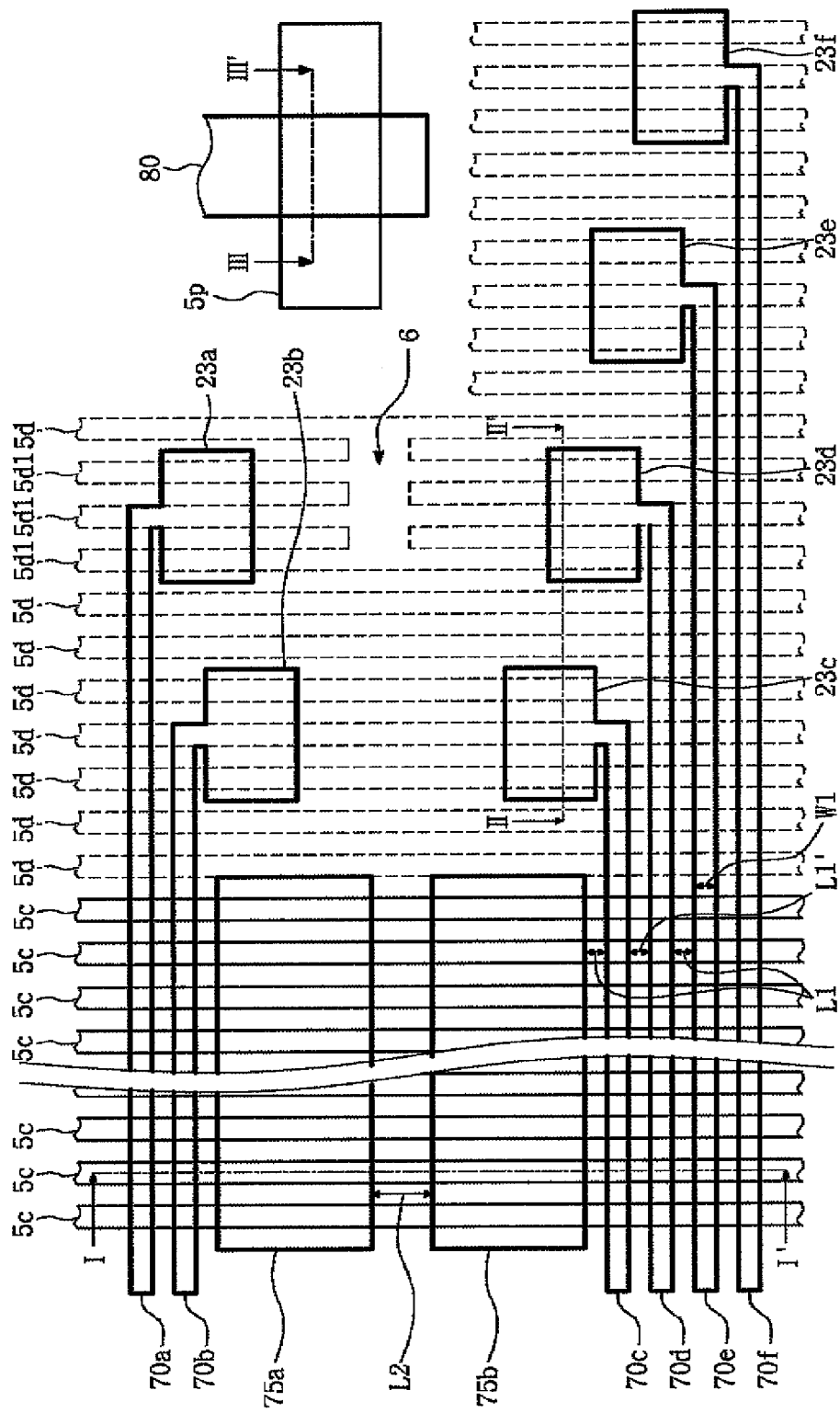
Figure 8B:
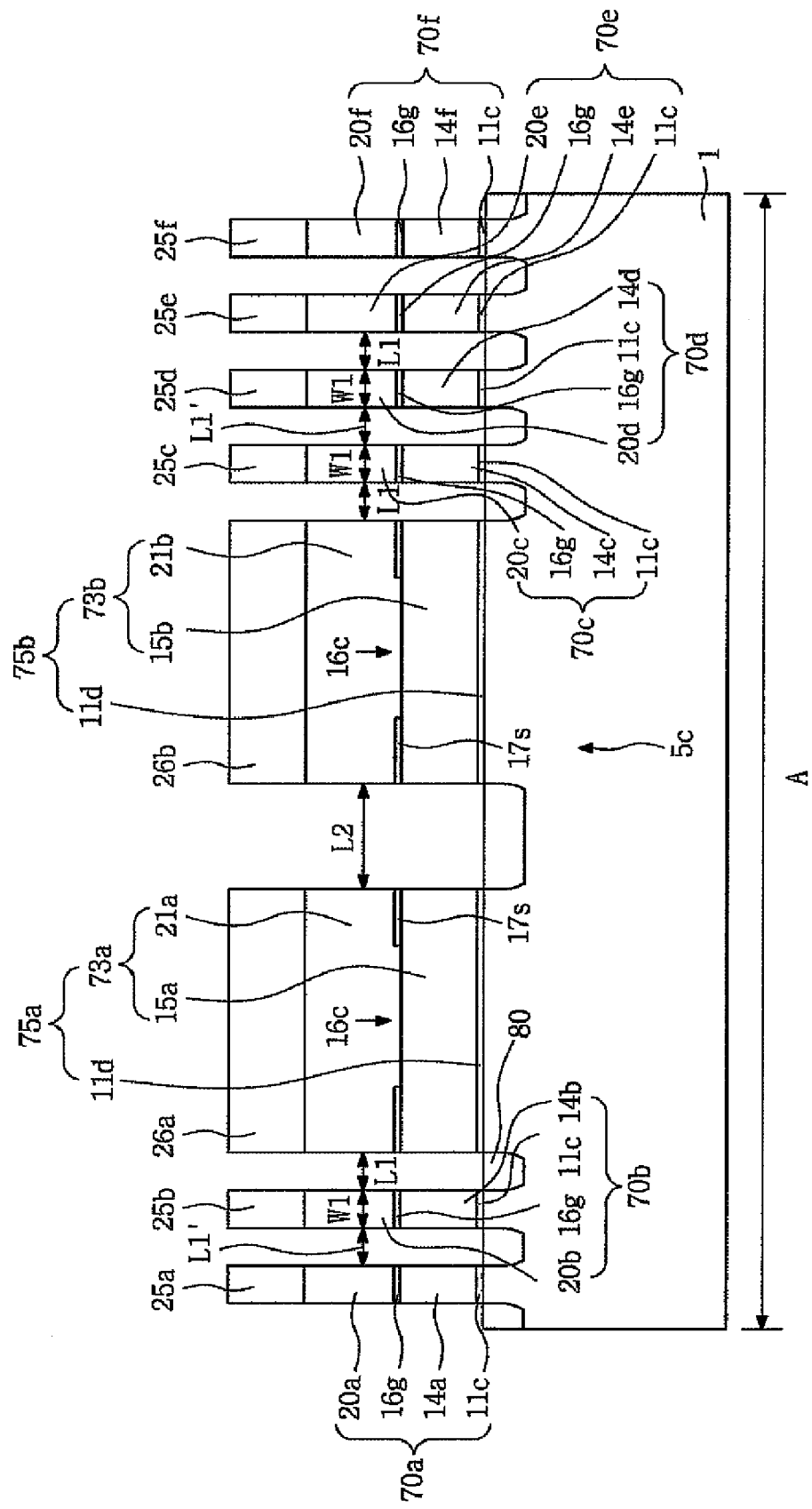
Figure 8C:
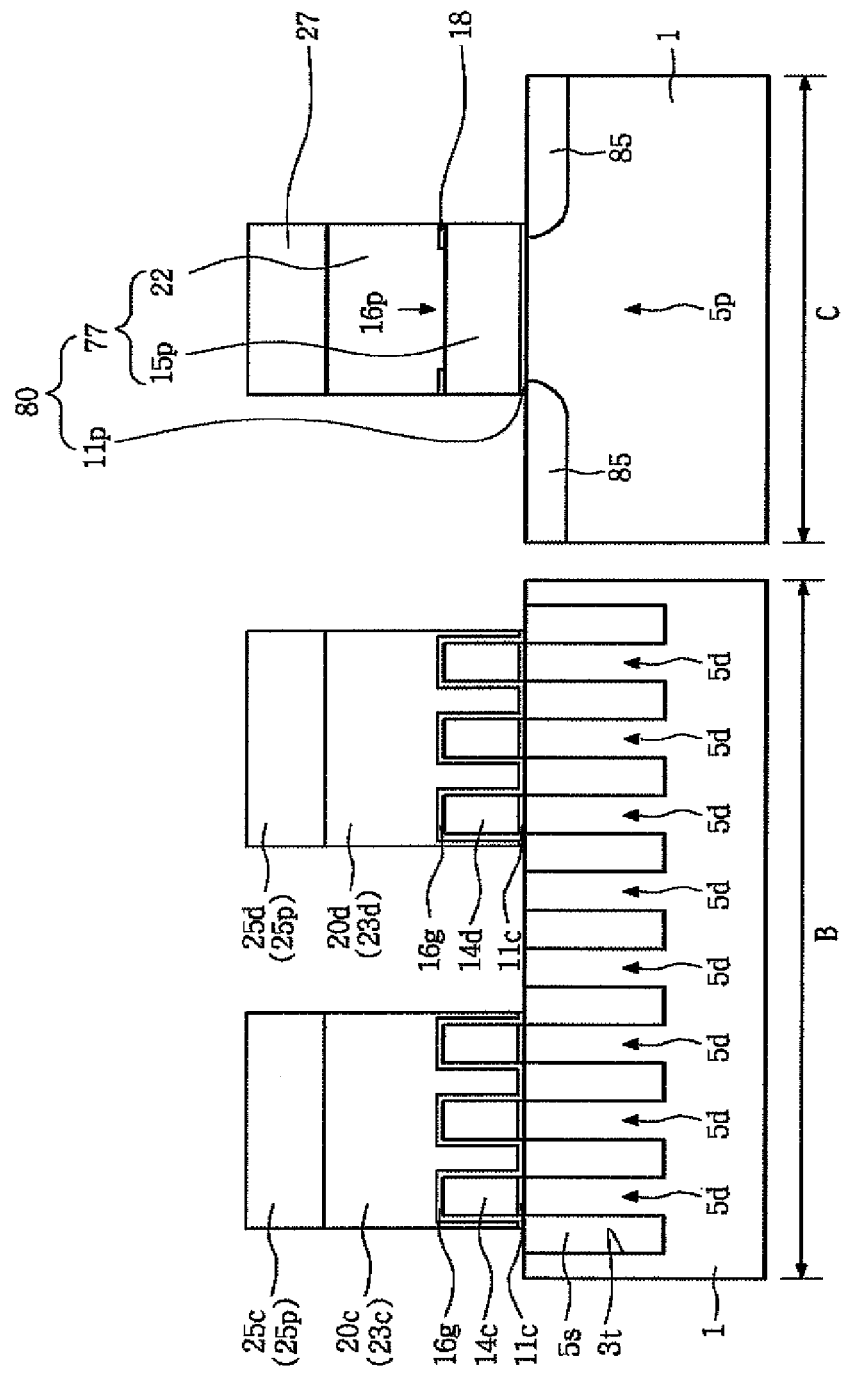

Referring to FIGS. 8A, 8B and 8C, the first mask layer 25, the gate conductive layer 20, the inter-gate dielectric layer 16 and the conductive patterns 13c, 13d and 13p disposed below the first upper mask pattern features 30a, 30b, 30c, 30d, 30e and 30f, the second upper mask pattern features 32a and 32b and the peripheral upper mask pattern feature 33 are sequentially etched.

The etching of the first mask layer 25 forms first mask pattern features 25a, 25b, 25c, 25d, 25e and 25f below the first upper mask pattern features 30a, 30b, 30c, 30d, 30e and 30f, second mask pattern features 26a and 26b below the second upper mask pattern features 32a and 32b, and a peripheral mask pattern feature 27 below the peripheral upper mask pattern features 33, respectively. The ends of the first mask pattern features 25a, 25b, 25c, 25d, 25e and 25f, which are disposed above the dummy active regions 5d, constitute a pad mask pattern 25p.

The etching of the gate conductive layer 20 forms first upper gate lines 20a, 20b, 20c, 20d, 20e and 20f below the first mask pattern features 25a, 25b, 25c, 25d, 25e and 25f, second upper gate lines 21a and 21b below the second mask pattern features 26a and 26b and a peripheral upper pattern 22 below the peripheral mask pattern feature 27. The ends of the first upper gate lines 20a, 20b, 20c, 20d, 20e and 20f, which are disposed above the dummy active regions 5d, constitute pad regions 23a, 23b, 23d, 23e and 23f, respectively.

The etching of the inter-gate dielectric layer 16 forms a first inter-gate dielectric pattern 16g below the first mask pattern features 25a, 25b, 25c, 25d, 25e and 25f, a second inter-gate dielectric pattern 17s below the second mask patterns 26a and 26b, and a peripheral inter-gate dielectric pattern 18 below the peripheral mask pattern feature 27. The second inter-gate dielectric pattern 17s includes the first openings 16c in the inter-gate dielectric layer 16, and the peripheral inter-gate dielectric pattern 18 includes the second opening 16p in the inter-gate dielectric layer 16.

In an embodiment (not shown), the width of the peripheral mask pattern 27 may be less than that of the second opening 16p. Furthermore, the peripheral inter-gate dielectric pattern 18 may be omitted when the peripheral mask pattern 27 is formed entirely within a region corresponding to a projection (in the vertical direction) of the second opening 16p.

The etching of the conductive patterns 13c, 13d and 13p forms floating gate electrodes 14a, 14b, 14c, 14d, 14e and 14f below the first mask pattern features 25a, 25b, 25c, 25d, 25e and 25f, second lower gate patterns 15a and 15b below the second mask pattern features 26a and 26b and a peripheral lower pattern 15p below the peripheral mask pattern 27. The second lower gate patterns 15a and 15b may be electrically connected to the second upper gate lines 21a and 21b to constitute second gate electrodes 73a and 73b. Also, the peripheral lower pattern 15p may be electrically connected to the peripheral upper pattern 22 to constitute a peripheral conductive pattern or a peripheral gate electrode 77.

The embodiment described above may be used to form a device comprising a flash memory. In this case, the first upper gate lines 20a, 20b, 20c, 20d, 20e and 20f can serve as cell gate lines including a control gate electrode of the flash memory, and the second gate electrodes 73a and 73b can serve as selection gate lines including a selection gate electrode of the flash memory.

The first gate dielectric layer 10c is also etched to thereby form a first gate dielectric pattern 11c below the first mask pattern features 25a, 25b, 25c, 25d, 25e and 25f, a second gate dielectric pattern 11d below the second mask pattern features 26a and 26b, and a peripheral dielectric pattern 11p below the peripheral mask pattern feature 27.

Therefore, first gate patterns 70a, 70b, 70c, 70d, 70e and 70f are formed below the first mask pattern features 25a, 25b, 25c, 25d, 25e and 25f, respectively, second gate patterns 75a and 75b are formed below the second mask pattern features 26a and 26b, respectively, and a peripheral pattern 80 is formed below the peripheral mask pattern 27 may be formed. The first gate patterns 70a, 70b, 70c, 70d, 70e and 70f are constituted by the first gate dielectric pattern 11c, the floating gate electrodes 14a, 14b, 14c, 14d, 14e and 14f, the first inter-gate dielectric pattern 16g and the first upper gate lines 20a, 20b, 20c, 20d, 20e and 20f, stacked one atop the other in the foregoing order. The second gate patterns 75a and 75b are constituted by the second gate dielectric pattern 11d, the second lower gate patterns 15a and 15b, the second upper gate lines 21a and 21b, stacked one atop the other in the foregoing order. The second lower gate patterns 15a and 15b may be electrically connected to the second upper gate lines 21a and 21b through the first openings 16c, respectively. The peripheral pattern 80 is constituted by the peripheral dielectric pattern 11p, the peripheral lower pattern 15p and the peripheral upper pattern 22, stacked one atop the other in the foregoing order. The peripheral lower pattern 15p and the peripheral upper pattern 22 may be electrically connected through the second opening 16p.

In some embodiments, the peripheral pattern 80 is formed as a gate electrode of a MOS transistor of a peripheral circuit region. However, the inventive concept is not so limited. Alternatively, the peripheral pattern 80 may instead be formed as an alignment key for use in a photolithography process, a resistor, or an electrode of a capacitor.

Referring again to FIGS. 8A, 8B and 8C, the spacer patterns 55a, 55b, 55c, 55d, 55e and 55f and the second spacers 46a and 46b may be removed as the first gate patterns 70a, 70b, 70c, 70d, 70e and 70f, the second gate patterns 75a and 75b and the peripheral pattern 80 are formed. For example, when the spacer patterns 55a, 55b, 55c, 55d, 55e and 55f and the second spacers 46a and 46b are of a silicon oxide, and the first mask layer 25 is of a silicon oxide, the spacer patterns 55a, 55b, 55c, 55d, 55e and 55f and the second spacers 46a and 46b can be removed by the same process used to etch the first mask layer 25.

Similarly, the first upper mask pattern features 30a, 30b, 30c, 30d, 30e and 30f, the second upper mask pattern features 32a and 32b and the peripheral upper mask pattern 33 may be removed as the first gate patterns 70a, 70b, 70c, 70d, 70e and 70f, the second gate patterns 75a and 75b and the peripheral pattern 80 are formed. For example, when the first upper mask pattern features 30a, 30b, 30c, 30d, 30e and 30f, the second upper mask pattern features 32a and 32b and the peripheral upper mask pattern 33 are of polysilicon, and at least one of the gate conductive layer 20 and the conductive patterns 13c, 13d and 13p is of polysilicon, the first upper mask pattern features 30a, 30b, 30c, 30d, 30e and 30f, the second upper mask pattern features 32a and 32b and the peripheral upper mask pattern 33 can be removed by the same process used to etch the gate conductive layer 20 and/or the conductive patterns 13c, 13d and 13p.

Alternatively, though, when the first upper mask pattern features 30a, 30b, 30c, 30d, 30e and 30f, the second upper mask pattern features 32a and 32b and the peripheral upper mask pattern 33 are formed of insulating material such as silicon nitride or SiON, the first upper mask pattern features 30a, 30b, 30c, 30d, 30e and 30f, the second upper mask pattern features 32a and 32b and the peripheral upper mask pattern 33 may be left on the substrate.

Next, source/drain regions 80 may be formed in the first active regions 5c disposed at both sides of the first and second gate patterns 70a, 70b, 70c, 70d, 70e, 70f, 75a and 75b. Meanwhile, a body contact impurity region of a conductivity different from that of the source/drain regions 80 may be formed in the body contact region 6. An impurity region may also be formed in the second active region 5p at both sides of the peripheral pattern 80.

According to the embodiment described above, the first upper gate lines 20a, 20b, 20c, 20d, 20e and 20f are formed below the first mask patterns 25a, 25b, 25c, 25d, 25e and 25f and the second upper gate lines 21a and 21b are formed below the second mask patterns 26a and 26b. Adjacent ones of the first upper gate lines 20a, 20b, 20c, 20d, 20e and 20f are spaced apart from one another by first distances L1 and L1'. The second upper gate lines 21a and 21b are spaced apart from one another by a second distance L2 greater than the first distances L1 and L1'. However, each of the first upper gate lines 20b and 20c disposed closest to the second upper gate lines 21a and 21b is spaced apart from the adjacent second upper gate line 21a and 21b by the same distance L1 even though the widths of the first upper gate lines 20a, 20b, 20c, 20d, 20e and 20f are considerably different from those of the second upper gate lines 21a and 21b.

Furthermore, the first upper gate lines 20a, 20b, 20c, 20d, 20e and 20f and the wider second upper gate lines 21a and 21b are simultaneously formed. In this embodiment, the sacrificial pattern 37 is formed of pattern features 37a, 37b, 37c, 38a and 38b (FIG. 2) of a relatively low density, i.e., the distance S1 between the features of the pattern 37 is relatively great. It is thus relatively easy to form the sacrificial pattern 37 using a conventional photolithography process. On the other hand, the higher density second spacers 46a and 46b (FIG. 3) and the spacer patterns 55a, 55b, 55c, 55d, 55e and 55f (FIG. 5) are formed using an atomic layer deposition process that facilitates a controlling of their thicknesses. Therefore, the desired widths and spacing of the second spacers 46a and 46b and the spacer patterns 55a, 55b, 55c, 55d, 55e and 55f of FIG. 5 may be easily produced.

Furthermore, as described with reference to FIG. 6, even if the second auxiliary masks (61a and 61b of FIG. 6) are misaligned, the spacing between the second spacers 46a and 46b and the first spacer patterns 55b and 55c will not be affected as long as the second auxiliary masks (61a and 61b of FIG. 6) are misaligned by an amount less than one half the thickness of the spacer layer. As a result, the desired sizes and spacing of the second upper gate lines 21a and 21b formed below the second spacers 46a and 46b and the second auxiliary masks 61a and 61b and the first upper gate lines 20a, 20b, 20c, 20d, 20e and 20f formed below the spacer patterns (55a, 55b, 55c, 55d, 55e and 55f of FIG. 5) may be easily produced.

In addition, the method according to the inventive concept as described above is not limited to the forming of gates. Rather, the method may be employed to form interconnections of a semiconductor integrated circuit.

Figure 9A:
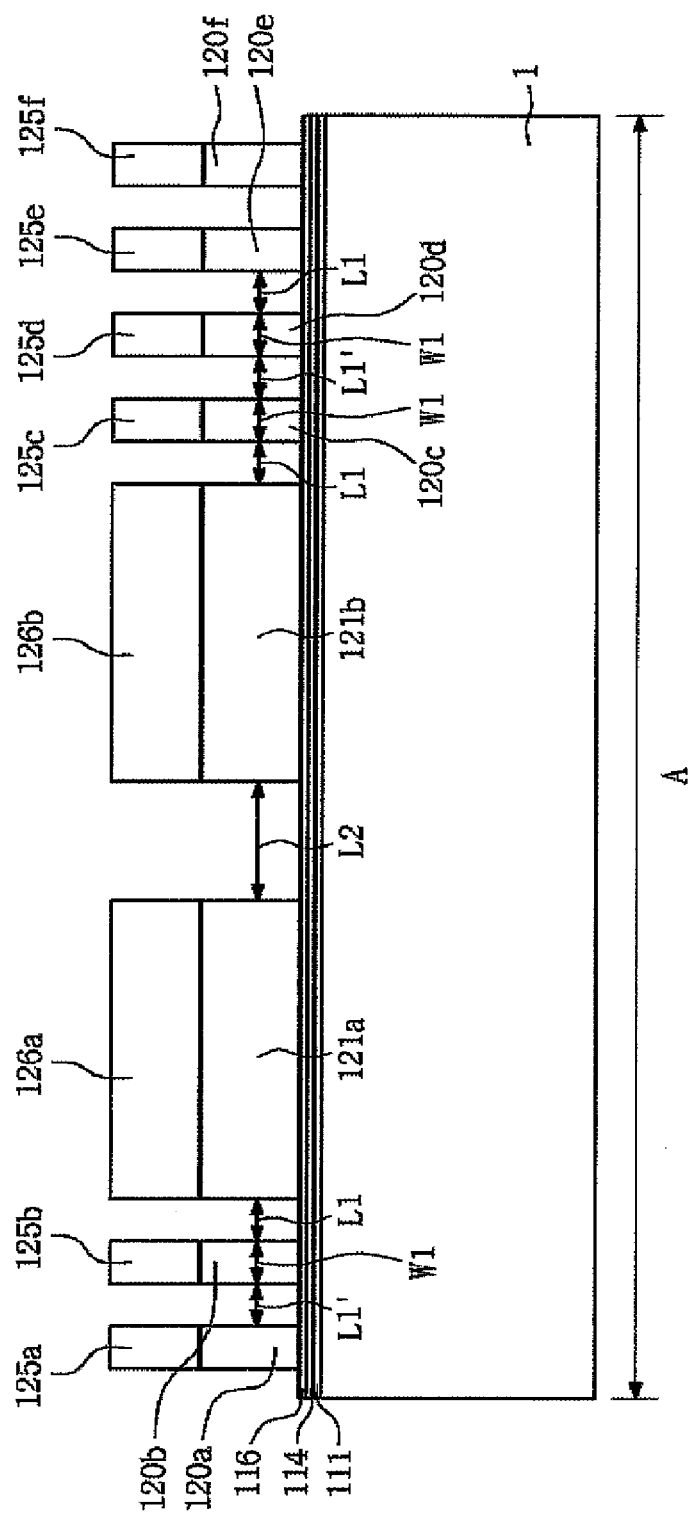
FIGS. 9A and 9B are sectional views of regions of another semiconductor device manufactured according to the inventive concept.
Figure 9B:
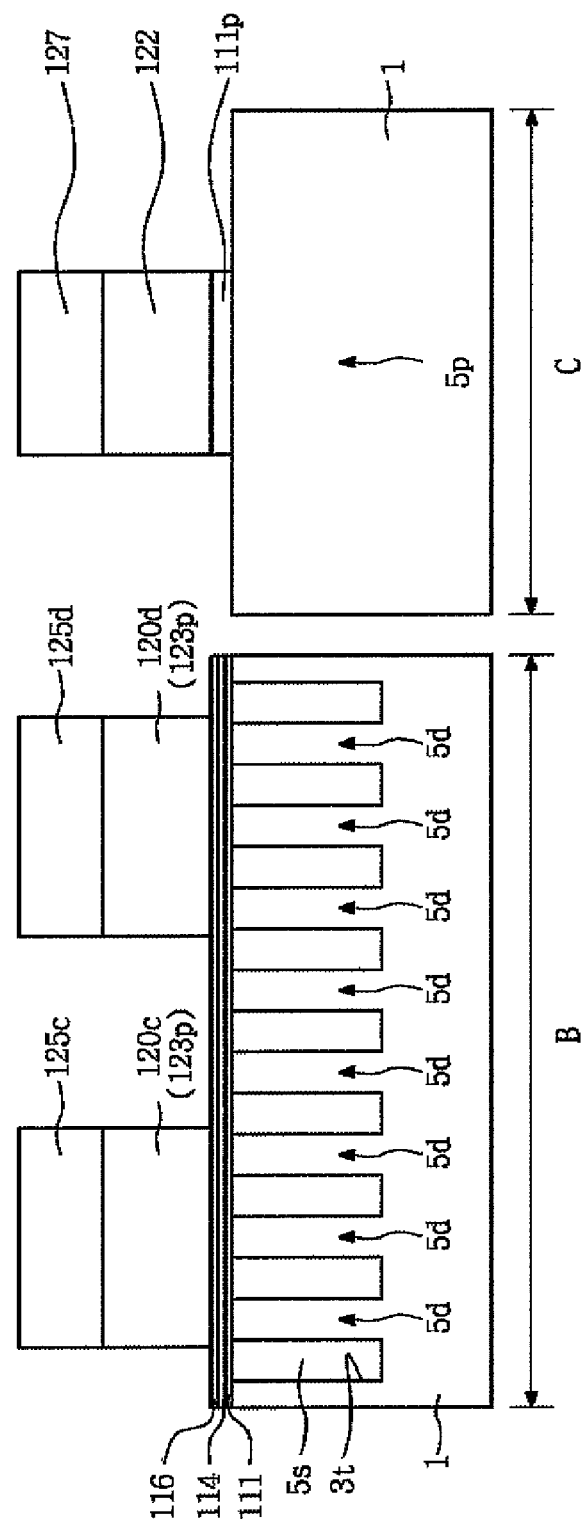

Also, although the above-described embodiments have been described in connection with the fabricating of a memory device having floating gate, the method according to the inventive concept is not so limited. For example, as illustrated in FIGS. 9A and 9B, a first dielectric layer 111, an information storage layer 114 and a second dielectric layer 116 may be formed by the method instead of the first gate dielectric patterns 11c, the floating gate electrodes 14a, 14b, 14c, 14d, 14e and 14f and the first inter-gate dielectric patterns 16g as described with reference to FIGS. 1 to 8B.

In this case, the first dielectric layer 111 may be a tunnel dielectric layer. The first dielectric layer 111 may comprise at least one film of material selected from the group consisting of silicon oxide, SiON, nitrogen doped Si oxide and a high-k dielectric. High-k dielectrics have a greater dielectric constant than silicon oxide and include aluminum oxide (AlO), zirconium oxide (ZrO), hafnium oxide (HfO) and lanthanum oxide (LaO).

The information storage layer 114 may form a region of a non-volatile memory device at which information is stored, such as a flash. For example, the information storage layer 114 may be a layer having traps capable of storing charges. To this end, the information storage layer 114 may include at least one film of material selected from the group consisting of SiON, silicon oxynitride, and a high-k dielectric. Moreover, the information storage layer 114 may comprise silicon quantum dots, germanium quantum dots, metal quantum dots, nano crystals or combinations thereof. The nano crystals may be of a type selected from the group consisting of tungsten (W), titanium (Ti), tantalum (Ta), copper (Cu), molybdenum (Mo), nickel (Ni) and nitrides thereof. The nano crystals may also be of at least one oxide of nano crystals selected from the group consisting of zirconium (Zr), hafnium (Hf), yttrium (Y), and aluminum (A) nano crystals. Furthermore, the nano crystals may be silicon nano crystals, Ge nano crystals, silicon nitride nano crystals, boron nano crystals or boron nitride nano crystals.

Alternatively, the information storage layer 114 may be a layer of material capable of possessing electrons such as a silicon layer, a Ge layer or Si—Ge layer.

The second dielectric layer 116 may be a blocking dielectric layer. To this end, the second dielectric layer 116 may include at least one high-k dielectric material.

Referring again to FIGS. 9A and 9B, a substrate substantially the same as that described with reference to FIGS. 1A to 1C is prepared. Then, the first gate dielectric layer 111 corresponding to the first gate dielectric layer 10c described with reference to FIGS. 2A to 2C is formed. Subsequently, the information storage layer 114 is formed (instead of the conductive patterns 13c, 13d, and 13p described with reference to FIGS. 2A to 2C). Then the second dielectric layer 116 is formed (instead of the inter-gate dielectric layer 16 described with reference to FIGS. 2A to 2C).

Meanwhile, a second gate dielectric layer 111p for a peripheral MOS transistor may be formed on the second active region 5p.

Then, the processes described with reference to FIGS. 2A to 2C through FIGS. 8A to 8C are performed. As a result, as shown in FIGS. 9A and 9B, first gate lines 120a, 120b, 120c, 120d, 120e and 120f, second gate lines 121a and 121b and a peripheral pattern 122 (corresponding to the first upper gate lines 20a, 20b, 20c, 20d, 20e and 20f, the second upper gate lines 21a and 21b and the peripheral upper pattern 22, respectively) are formed. Also, the ends of the first gate lines 120a, 120b, 120c, 120d, 120e and 120f on the dummy active regions 5d constitute pad regions 123p.

Also, in FIGS. 9A and 9B, reference numerals 125a, 125b, 125c, 125e and 125f designate first mask pattern features, reference numerals 126a and 126b designate second mask pattern features and reference numeral 127 designates a peripheral mask pattern corresponding to the first mask pattern features 25a, 25b, 25c, 25d, 25e and 25f, the second mask pattern features 26a and 26b and the peripheral mask pattern feature 27 illustrated in FIGS. 8A to 8C, respectively, and may be formed by substantially the same method.

Other variations of the above-described embodiments of a method of forming a semiconductor device according to the inventive concept will be described below.

First, a variation in the process of forming the first sacrificial pattern features 37a, 37b and 37c and the second sacrificial pattern features 38a and 38b described with reference to FIGS. 2A to 2C will be described with reference to FIGS. 10 and 11.

Figure 10:
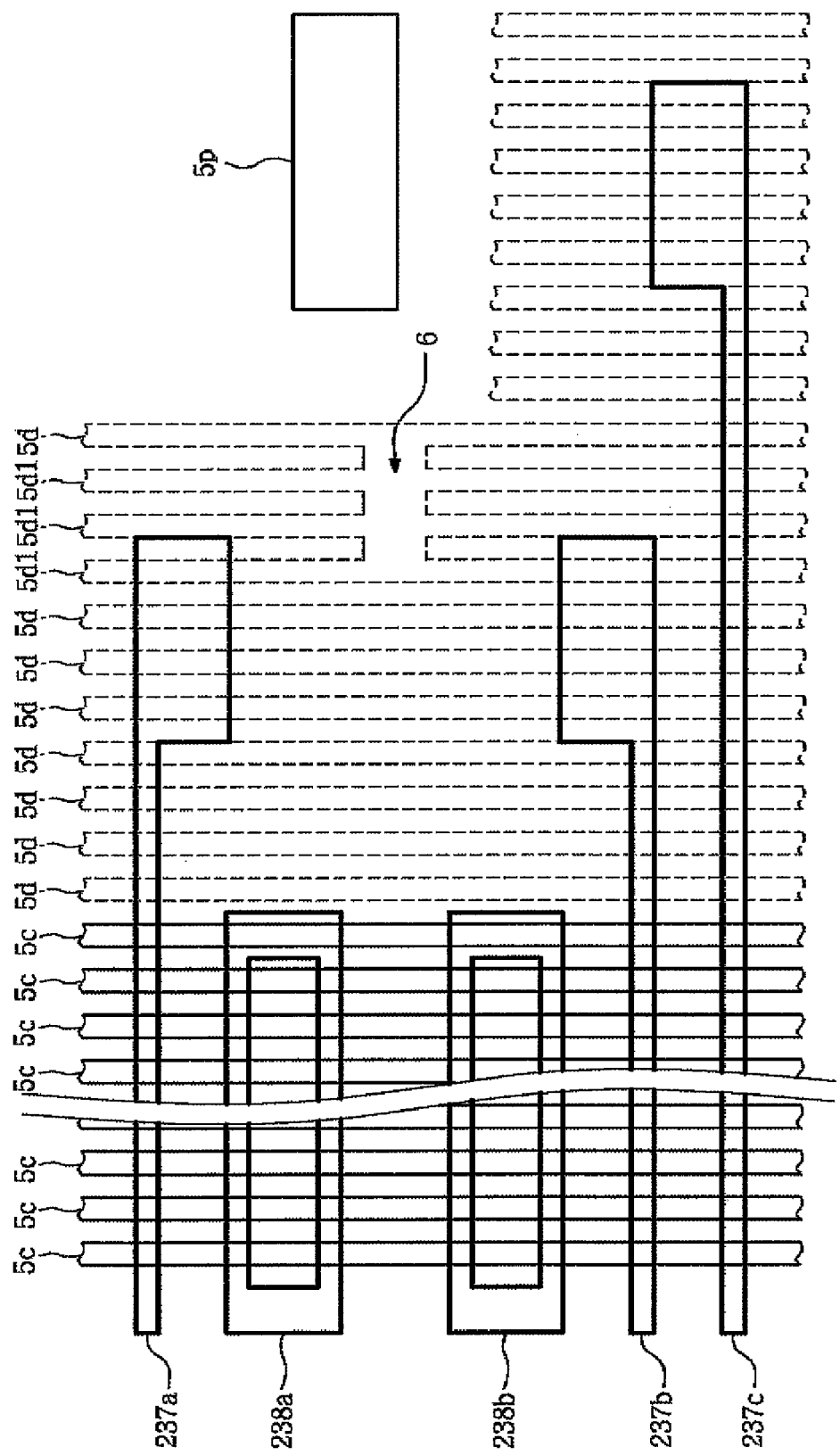
FIGS. 10 and 11 are plan views of a substrate of another form of a semiconductor device during a method of manufacturing the device in accordance with the inventive concept.

Referring to FIG. 10, first sacrificial pattern features 237a, 237b and 237c corresponding to the first sacrificial pattern features 37a, 37b and 37c and second sacrificial pattern features 238a and 238b corresponding to the second sacrificial pattern features 38a and 38b are formed so that respective ends of the first sacrificial pattern features 237a, 237b and 237c and the second sacrificial pattern features 238a and 238b are aligned.

Figure 11:
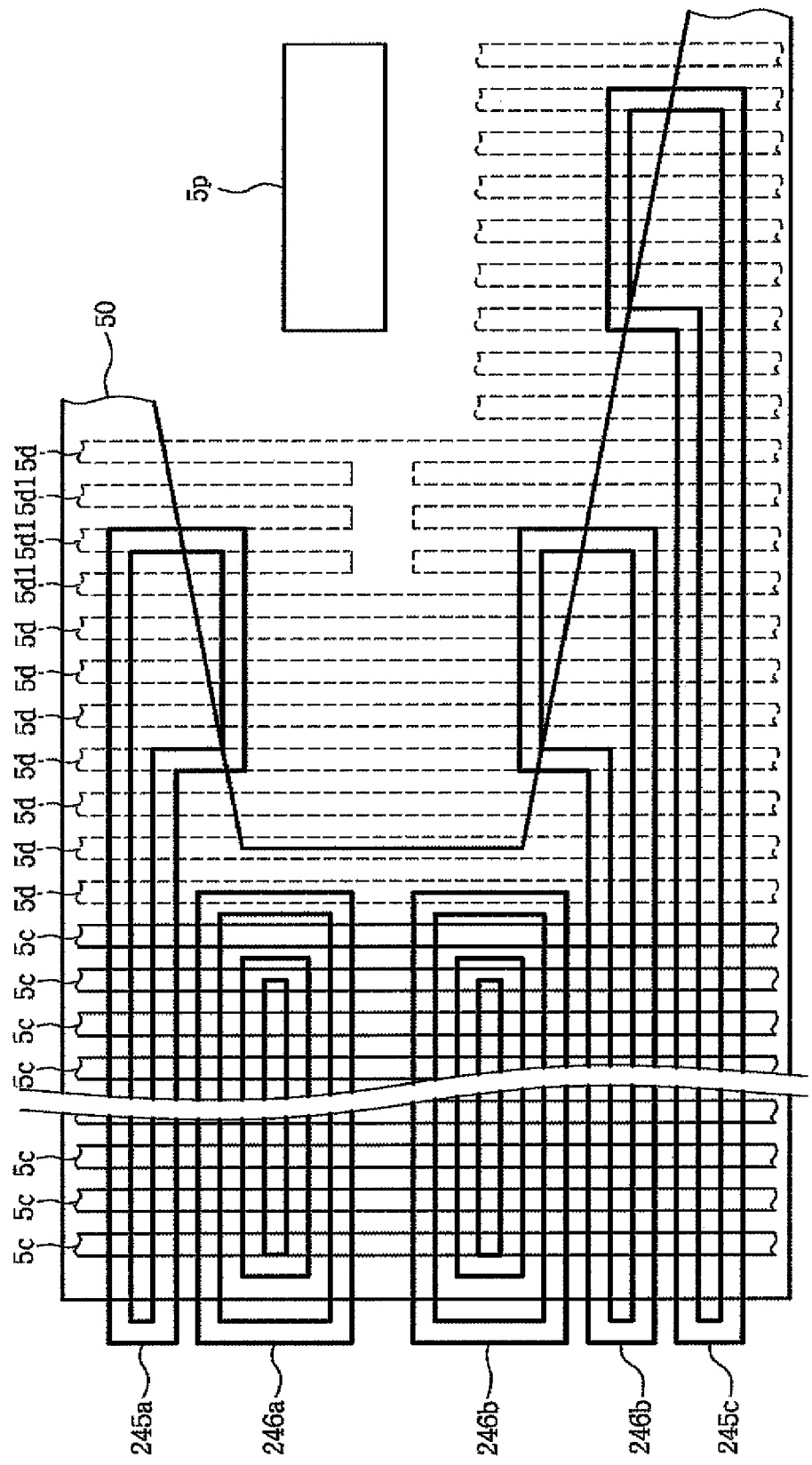

Referring to FIG. 11, first spacers 245a, 245b and 245c and second spacers 246a and 246b are formed on the sidewalls of the first sacrificial pattern features 237a, 237b and 237c and the second sacrificial pattern features 238a and 238b, respectively. A photoresist pattern 250 corresponding to the photoresist pattern 50 illustrated in FIG. 4A is formed. In this case, the photoresist pattern 250 of FIG. 11 exposes the ends of the second spacers 246a and 246b in addition to the ends of the first spacers 245a, 245b and 245c. Then processes substantially the same as those described with reference to FIGS. 4A to 8C are then performed.

In a variation shown FIG. 12, first sacrificial pattern features 337a, 337b and 337c are formed in the same manner as the first sacrificial pattern features 37a, 37b and 37c and second sacrificial pattern features 338a and 338b are formed in the same manner the second sacrificial pattern features 38a and 38b However, each of the second sacrificial pattern features 338a and 338b is formed as a plurality of line patterns 337a and 337b. Furthermore, each of the line patterns 337a and 337b constituting the second sacrificial pattern features 338a and 338b are formed to have substantially the same width Z2 as the width Z1 of the line portions of each of the first sacrificial pattern features 337a, 337b and 337c. Therefore, the line patterns 337a and 337b of the second sacrificial patterns 338a and 338b and the first sacrificial pattern features 337a, 337b and 337c can be formed using a photolithography process without the need to take measures to prevent those processing errors which can occur in a photolithography process when patterns of different sizes are formed adjacent to each other.

The ends of the first sacrificial pattern features 337a, 337b and 337c can be formed as offset in the longitudinal direction with respect to the corresponding ends of the second sacrificial pattern features 338a and 338b similar to the structure illustrated in and formed in the manner described with reference to FIG. 2A. Alternatively, respective ends of the first sacrificial pattern features 337a, 337b and 337c and the second sacrificial pattern features 338a and 338b may be aligned as illustrated in FIG. 10.

Furthermore, the above-described aspects of the first sacrificial pattern features 337a, 337b and 337c and the line patterns 337a and 337b constituting the second sacrificial pattern features 338a and 338b may be applied to the previously described embodiments. For example, in the embodiments illustrated in and described with reference to FIGS. 2A and 10, the width of each of the portions of the second sacrificial pattern features 38a and 238b which are parallel to the line portions of the first sacrificial patterns 37a and 237a may be substantially the same as the width of each of the line portions of the first sacrificial pattern features 37a and 237a.

Another embodiment of a method of fabricating a semiconductor device according to the inventive concept will be described with reference to FIGS. 13A to 16.

Figure 13A:
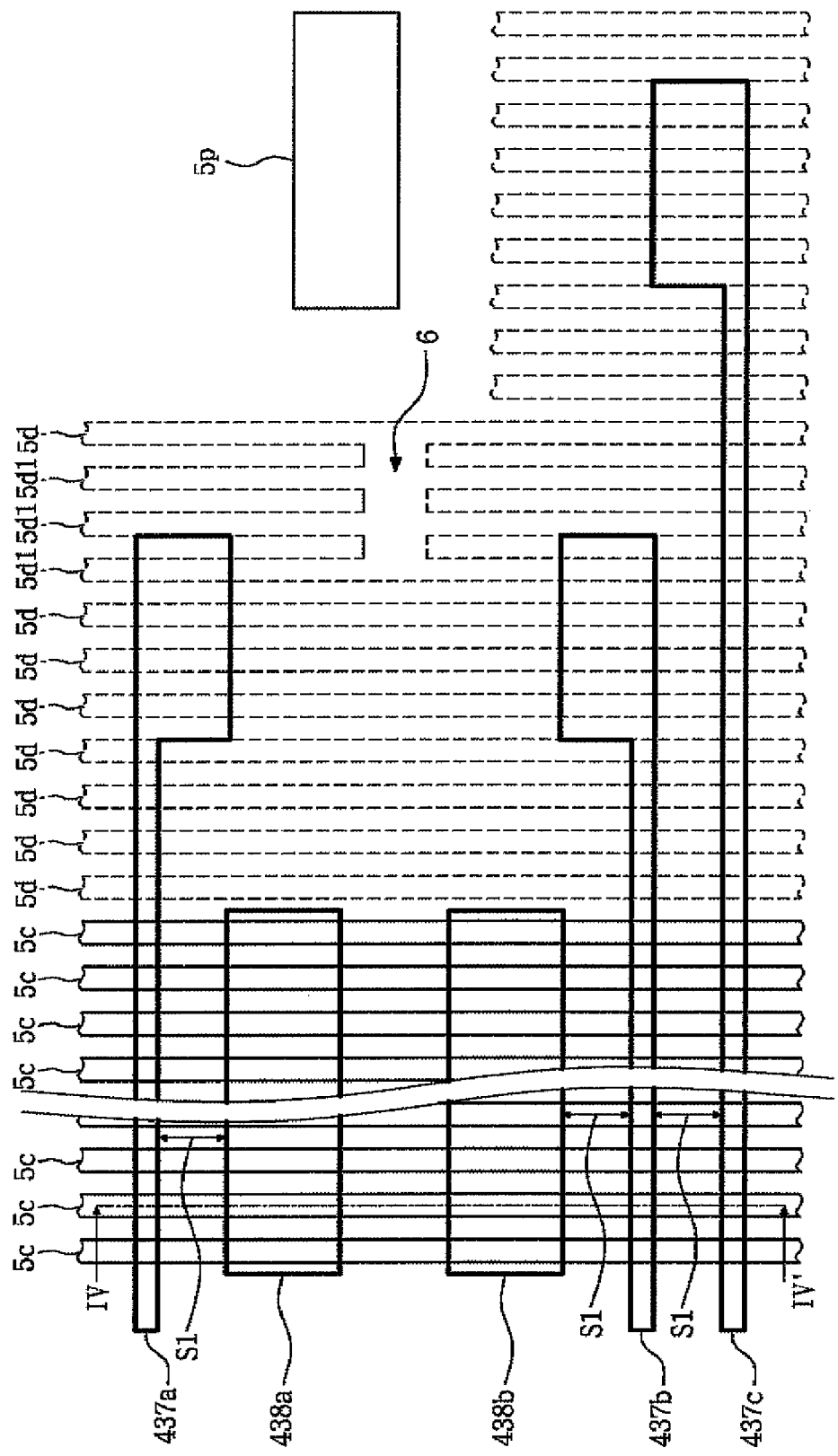
FIGS. 13A, 14A and 15A are plan views of a substrate during the course of another embodiment of a method of manufacturing a semiconductor device according to the inventive concept.
Figure 13B:
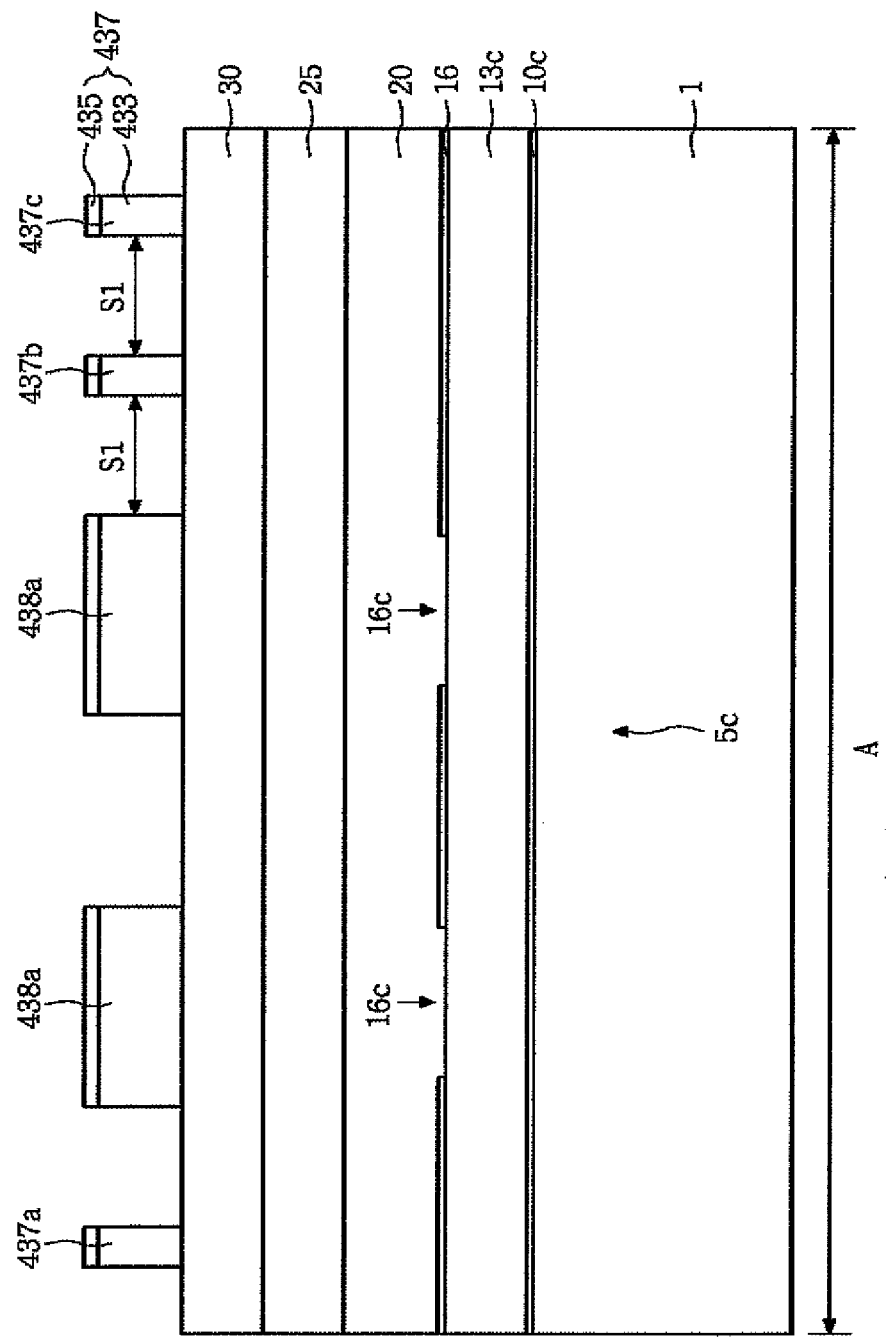

Referring first to FIGS. 13A and 13B, a substrate 1, isolation layer 5s, active regions 5c, 5d and 5p, second gate dielectric layers 10c and 10p, conductive patterns 13c, 13d, and 13p, inter-gate dielectric layer 16, underlying layer 20 and first and second mask layers 25 and 30 are provided/formed in the manner described with reference to FIG. 2A. Then first sacrificial pattern features 437a, 437b and 437c having shapes similar to those of the first sacrificial pattern features 37a, 37b and 37c illustrated in FIG. 2A, and second sacrificial pattern features 438a and 438b each having the shape of a relatively wide line, are formed in the same manner described with reference to the forming of the first sacrificial pattern features 37a, 37b and 37c and second sacrificial pattern features 38a and 38b. The sacrificial pattern features 437 each include a first sacrificial layer 433 and a second sacrificial layer 435 stacked on the first sacrificial layer 433.

Figure 14A:
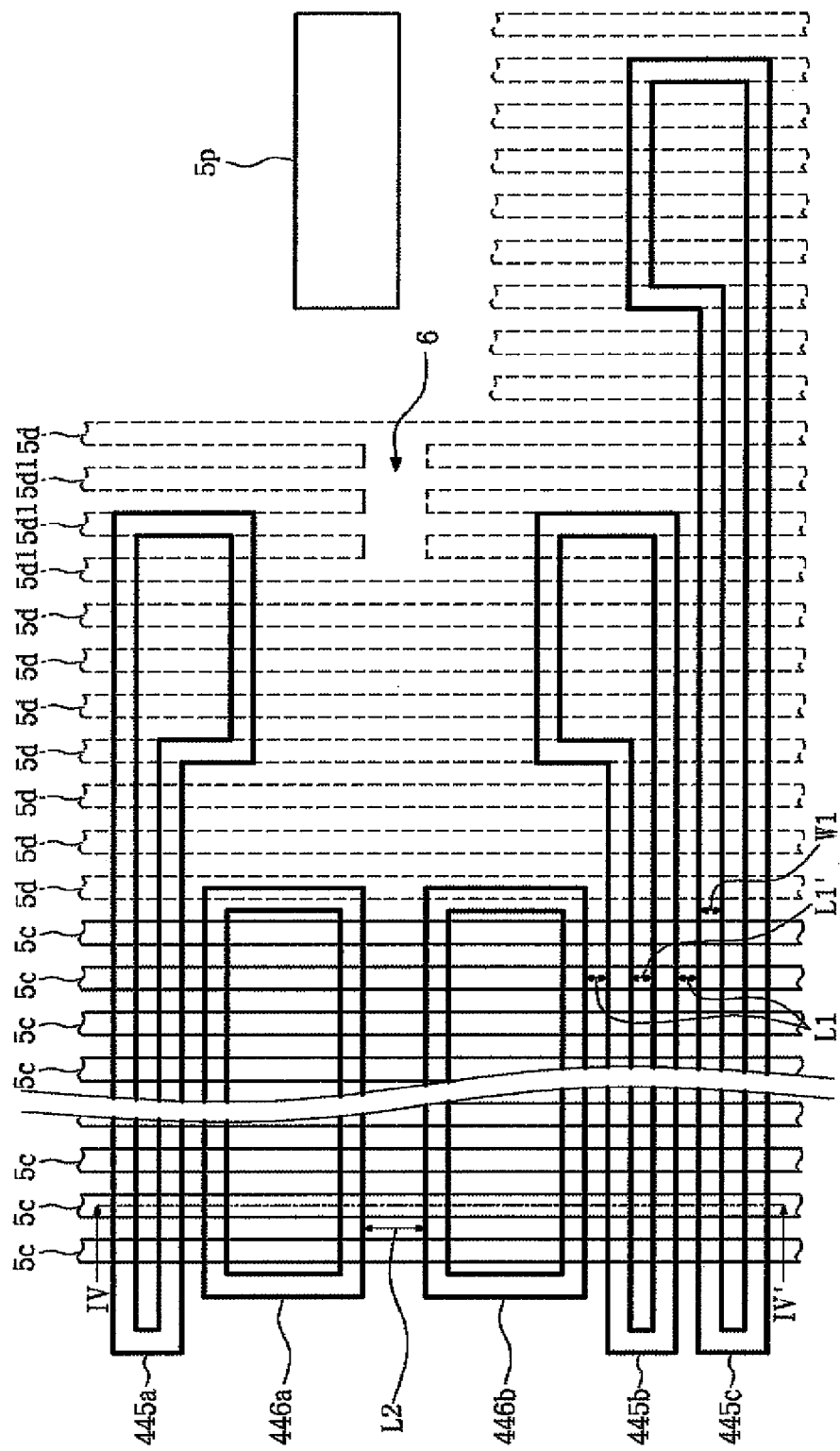
Figure 14B:
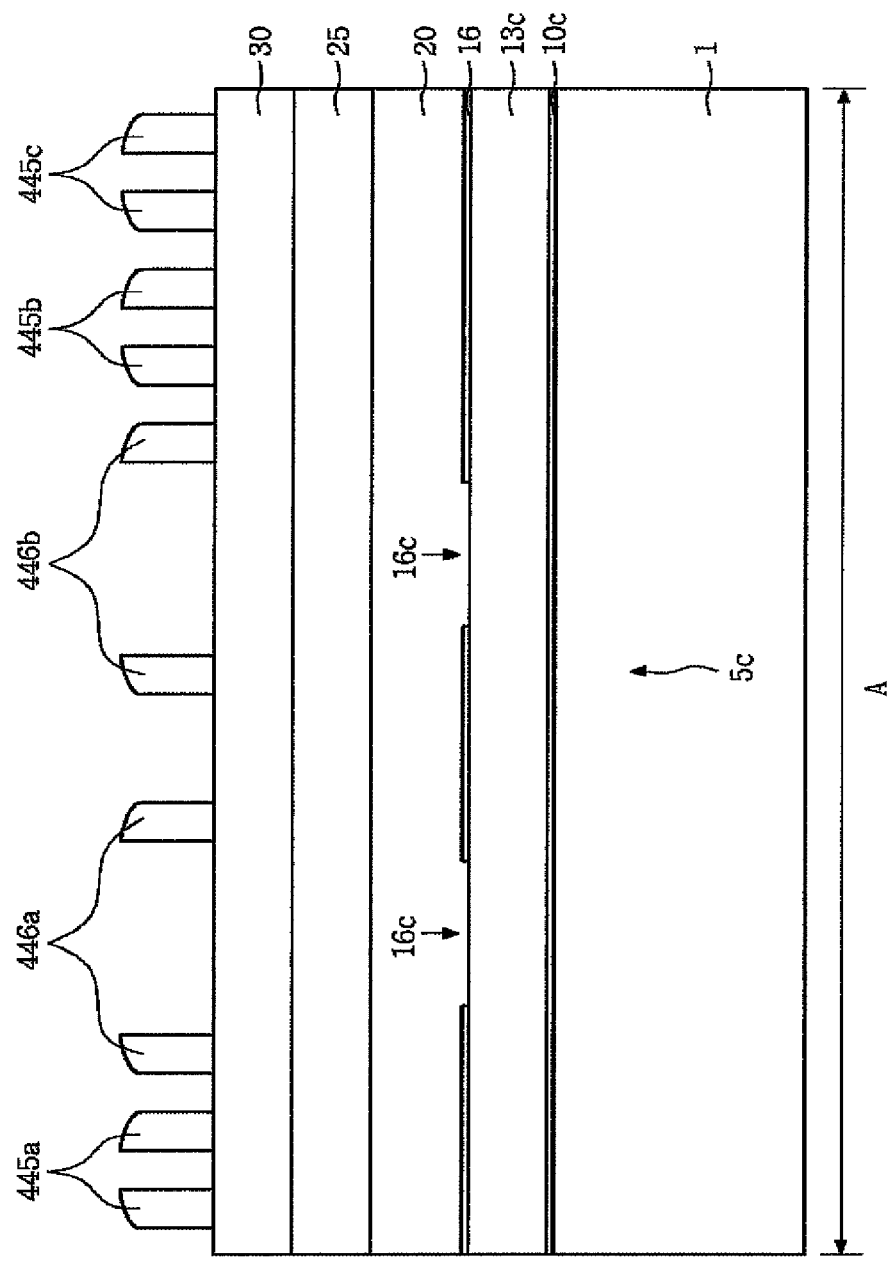

Referring to FIGS. 14A and 14B, in the manner described with reference to FIGS. 3A to 3C, a spacer layer is then formed, and the spacer layer is anisotropically etched to form spacers. The spacers include first spacers 445a, 445b and 445c on sidewalls of the first sacrificial pattern features 437a, 437b and 437c, and second spacers 446a and 446b on sidewalls of the second sacrificial pattern features 438a and 438b. Then, the first and second sacrificial pattern features 437a, 437b, 437c, 438a and 438b may be removed.

Figure 15A:
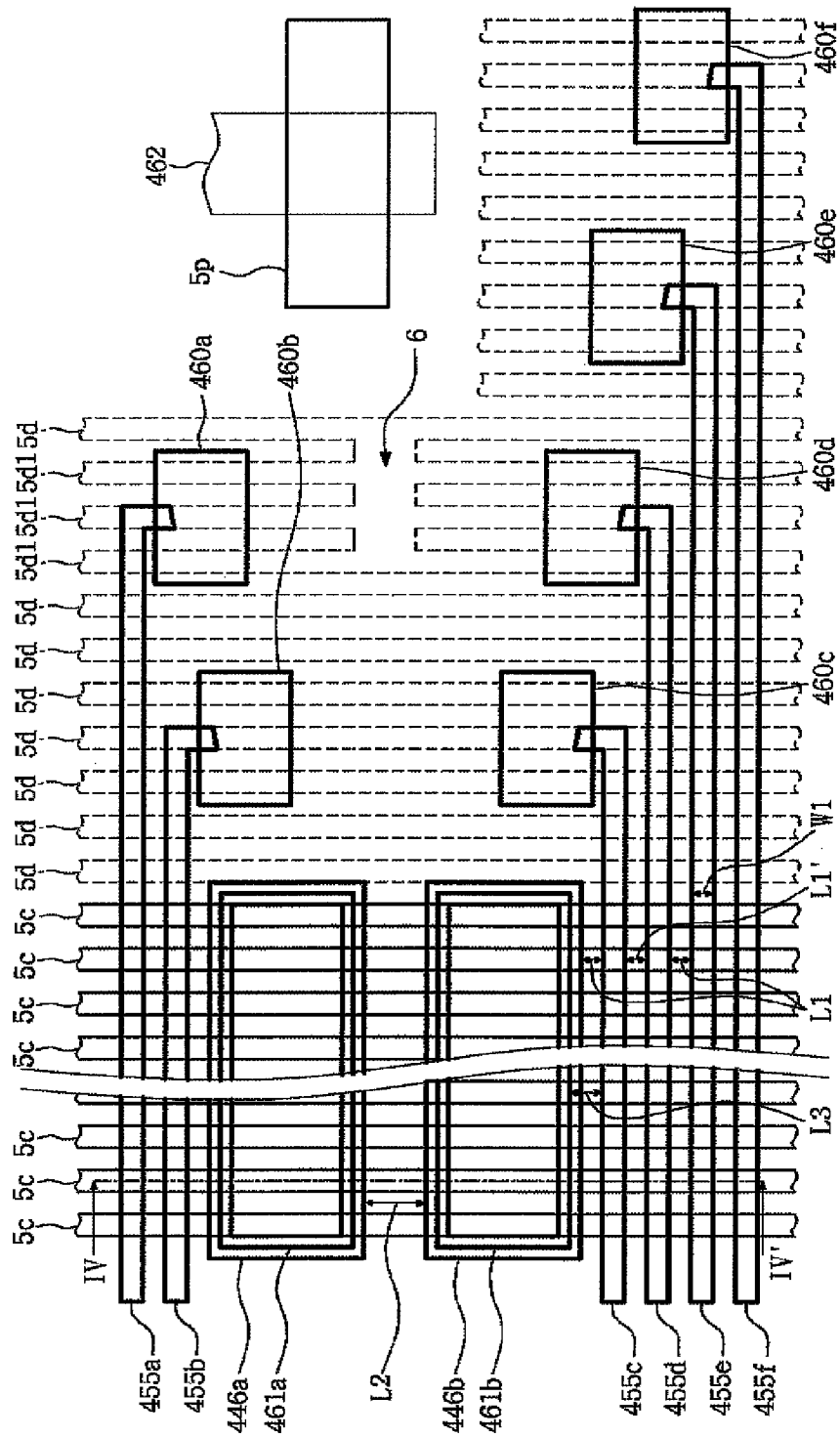

Referring to FIGS. 15A and 15B, substantially the same photolithography as that described with reference to FIGS. 4A to 4C may be performed to cut both ends of the first spacers 445a, 445b and 445c. As a result, the second spacers 446a and 446b may remain to be defined as second spacer patterns, and both ends of the first spacers may be cut to be formed as first spacer patterns 455a, 455b, 455c, 455d, 455e and 455f spaced apart from each other. That is, both ends of one first spacer 445a in the shape of a ring may be cut to be formed as two first spacer patterns 455a and 455b spaced apart from each other.

In some embodiments, the sacrificial pattern features 437a, 437b, 437c, 438a and 438b are removed before opposite ends of the first spacers 445a, 445b and 445c are cut off. Alternatively, the sacrificial pattern features 437a, 437b, 437c, 438a and 438b are removed after the opposite ends of the first spacers 445a, 445b and 445c are cut off.

Then, the second mask layer 30 is etched using the first spacer pattern features 455a, 455b, 455c, 455d, 455e and 455f and the second spacer pattern features 446a and 446b as etch masks. As a result, first upper mask patterns 430a, 430b, 430c, 430d, 430e and 430f are formed below the first spacer pattern features 455a, 455b, 455c, 455d, 455e and 455f, and second upper mask patterns 432a and 432b are formed below the second spacer pattern features 446a and 446b.

In this embodiment, in the region in which the pattern is relatively dense, i.e., in the region where the gaps between the adjacent ones of the spacer pattern features 455a, 455b, 455c, 455d, 455e, 455f, 446a and 446b are relatively narrow, the second mask layer 30 is etched vertically. On the other hand, in the region in which the pattern is less dense, i.e., in the region in which the gaps between the linear portions of the spacer pattern features 446a and 446b are relatively wide, the second mask layer 30 is etched in such a way that the opening therethrough becomes narrower in the downward direction due to the "loading effect". That is, the openings formed through second mask layer 30 in the region in which the spacer pattern has a relatively low density each have a bottom whose width D2 that is less than the width D1 of the top of the opening The "loading effect" is an effect that is well known to those of ordinary skill in the art and therefore, will not be described in detail.

Thus, the sidewalls SW1 of the second upper mask pattern features 446a and 446b adjacent to respective ones of the first upper mask pattern features 430a, 430b, 430c, 430d, 430e and 430f, namely the first upper mask pattern features 430b and 430c in FIG. 15B, have substantially the same gradient as the sidewalls of the first upper mask pattern features 430a, 430b, 430c, 430d, 430e and 430f. Furthermore, sidewalls SW2 of the second upper mask pattern features 432a and 432b that are not adjacent to one of the first upper mask pattern features 430a, 430b, 430c, 430d, 430e and 430f has a more gradual gradient than the sidewalls W1.

In particular, the first upper mask pattern features 430a, 430b, 430c, 430d, 430e and 430f are formed to have substantially vertical sidewalls. Also, the second upper mask pattern features 432a and 432b adjacent to the first upper mask pattern features 430b and 430c, i.e., facing the first upper mask pattern features 430b and 430c, may be formed so as to have substantially vertical sidewalls SW1, and the second upper mask pattern features 432a and 432b that are not adjacent to the first upper mask pattern features 430b and 430c are formed to have inclined sidewalls SW2 (sidewalls lying in planes that subtend acute angles with vertical planes). Therefore, each of the second upper mask pattern features 432a and 432b becomes broader in the downward direction.

Then, auxiliary masks 460a, 460b, 460c, 460d, 460e, 460f, 461a and 461b and peripheral sacrificial mask 462 are formed similar to the auxiliary masks 60a, 60b, 60c, 60d, 60e, 60f, 61a and 61b and the peripheral sacrificial mask 62 illustrated in and described with reference to FIGS. 6A to 6C. That is, first auxiliary masks 460a, 460b, 460c, 460d, 460e and 460f are formed over respective ends of the spacer patterns 455a, 455b, 455c, 455d, 455e and 455f, and second auxiliary masks 461a and 461b are formed over the second spacers 446a and 446b as described with reference to FIGS. 6A to 6C.

In this embodiment, the forming second auxiliary masks 461a and 461b may further has a greater process margin (margin for error) than the process of forming the second auxiliary masks 61a and 61b in the previous embodiments because the second upper mask patterns 432a and 432b are relatively wider due to their shape as described above.

Figure 16:
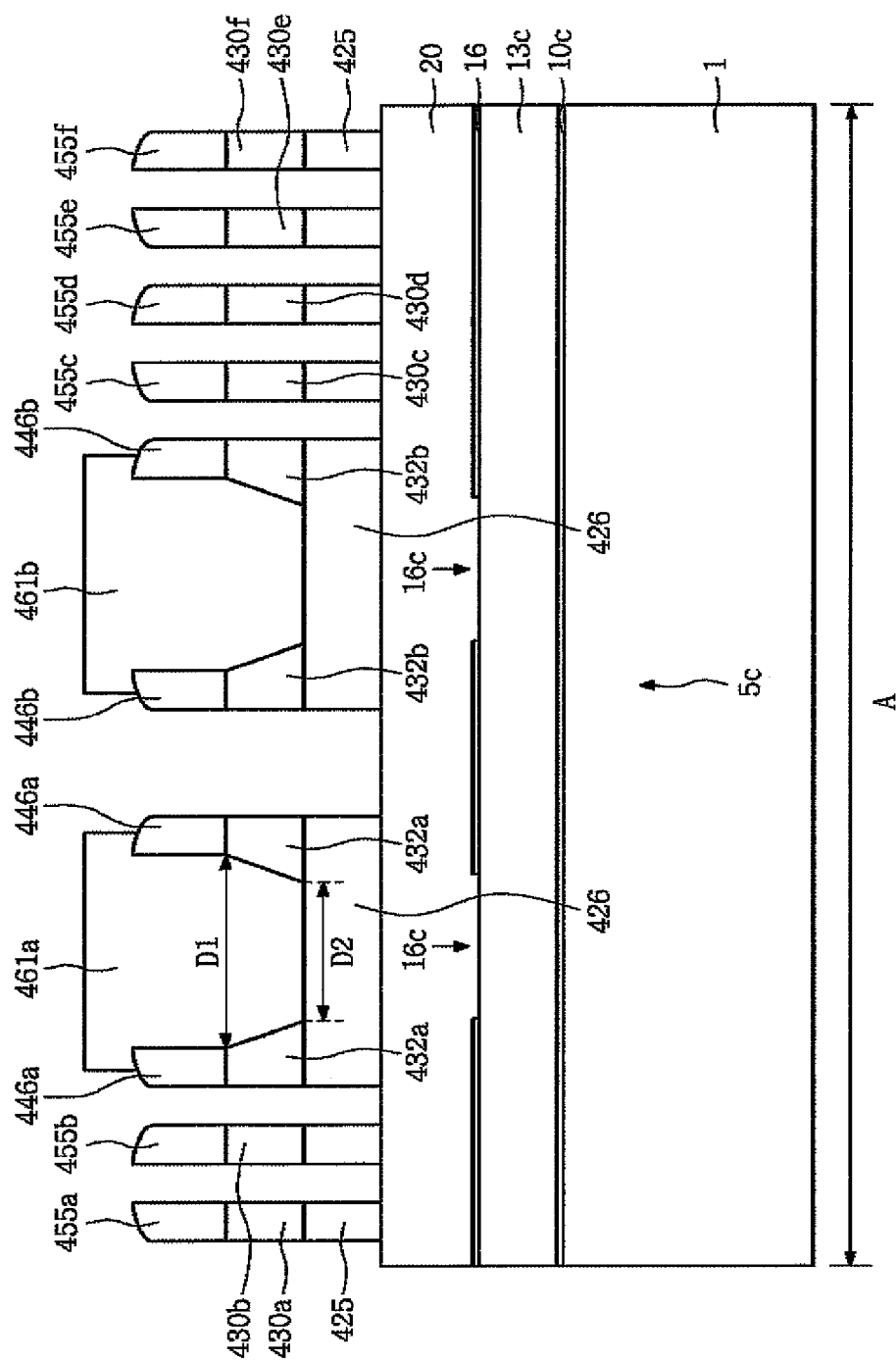
FIG. 16 is a sectional view of the semiconductor device taken along the same direction as line IV-IV' of FIG. 15A, at the time the device has been completed.

Referring to FIG. 16, the first mask layer 25 is etched by an etching process in which the auxiliary masks 460a, 460b, 460c, 460d, 460e, 460f, 461a and 461b, the peripheral sacrificial mask 462, the second spacer patterns 446a and 446b, the spacer patterns 455a, 455b, 455c, 455d, 455e and 455f, the first upper mask patterns 430a, 430b, 430c, 430d, 430e and 430f and the second upper mask patterns 432a and 432b are used as etch masks.

Alternatively, the confronting inclined sidewalls of the second upper mask patterns 432a and 432b, which are contiguous with the second spacer patterns 446a and 446b that face each other, respectively, are etched to become vertical. Then the first mask layer 25 is etched by an etching process in which the auxiliary masks 460a, 460b, 460c, 460d, 460e, 460f, 461a and 461b, the peripheral sacrificial mask 462, the second spacer patterns 446a and 446b, the spacer patterns 455a, 455b, 455c, 455d, 455e and 455f, the first upper mask patterns 430a, 430b, 430c, 430d, 430e and 430f and the second upper mask patterns 432a and 432b are used as etch masks.

In either case, as a result, a lower mask is formed in which some features 426 of the lower mask are wider than other features 425.

Afterwards, the auxiliary masks 460a, 460b, 460c, 460d, 460e, 460f, 461a and 461b, and the peripheral sacrificial mask 462 may be removed by an etching process. Also, the second spacer patterns 446a and 446b and the first spacer patterns 455a, 455b, 455c, 455d, 455e and 455f may be removed by an etching process.

Then, the underlying layer 20 and conductive patterns 13c, 13d and 13p are etched using the lower mask as an etch mask in a manner similar to that shown and described with reference to FIGS. 8A to 8C. Thus, this etching process will not be described in further detail.

Figure 17:
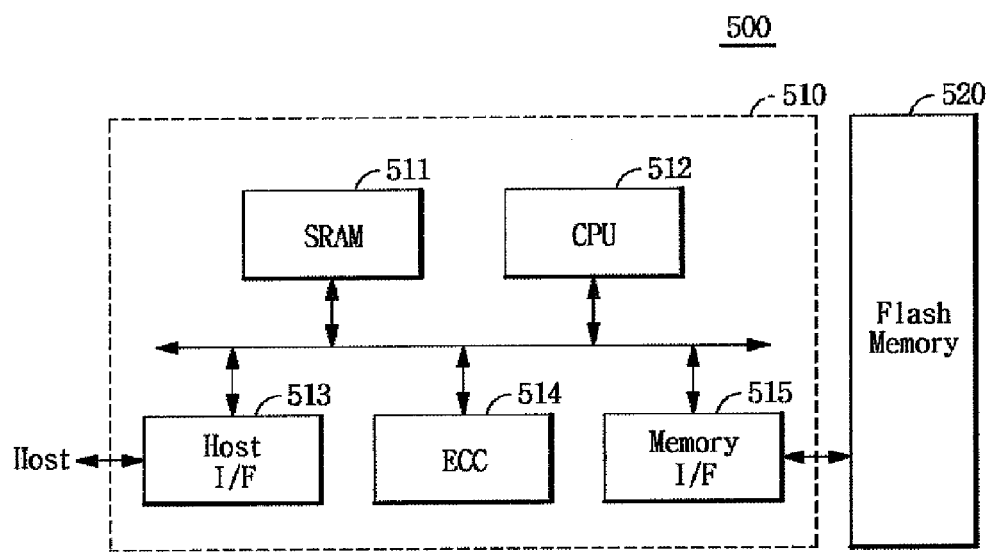
FIG. 17 is a block diagram of a memory system including a semiconductor device manufactured according to the inventive concept.

FIG. 17 is a block diagram of a memory system 500 to which the inventive concept can be applied. Referring to FIG. 17, the memory system 500 includes a flash memory device 520 and a memory controller 510. The flash memory device 520 may be provided in a multi-chip package consisting of a plurality of memory chips. A flash memory device is a non-volatile memory device that retains stored data even when power supplied thereto is cut off. A flash memory device is used to store code and data in mobile devices such as cellular phones, PDAs, digital cameras, portable game consoles, and MP3 players. A flash memory also has home applications such as in HDTVs, DVDs, routers, and GPS.

Such flash memory devices may be formed by a method according to the inventive concept. For example, the flash memory device 520 includes highly integrated patterns formed according to an example illustrated in and described with reference to FIGS. 1 to 16, so that the memory device 520 has a high capacity and a high degree of reliability.

The memory controller 510 is configured to control the flash memory device 520. The flash memory device 520 and the memory controller 510 may be provided as part of a memory card or a memory disk.

An SRAM 511 is used as an operation memory of a processing unit 512. A host interface 513 may include a data exchange protocol of a host connected to the memory system. An error correction block 514 detects and corrects errors included in data read from the flash memory device 520. A memory interface 515 interfaces with the flash memory device 520. The processing unit 512 may perform all necessary operations for data exchange of the memory controller 510. Furthermore, a ROM (not shown) storing code data for interfacing with the host may also be provided in the memory system 500.

The memory system may be embodied as a solid state disk (SSD) including a flash memory device manufactured by an embodiment of a method according to the inventive concept. In this case, the memory controller 510 may be structured and configured to communicate with the outside (e.g., a host) through one of various interface protocols such as USB, MMC, PCI-E, SATA, PATA, SCSI, ESDI, and IDE.

Figure 18:
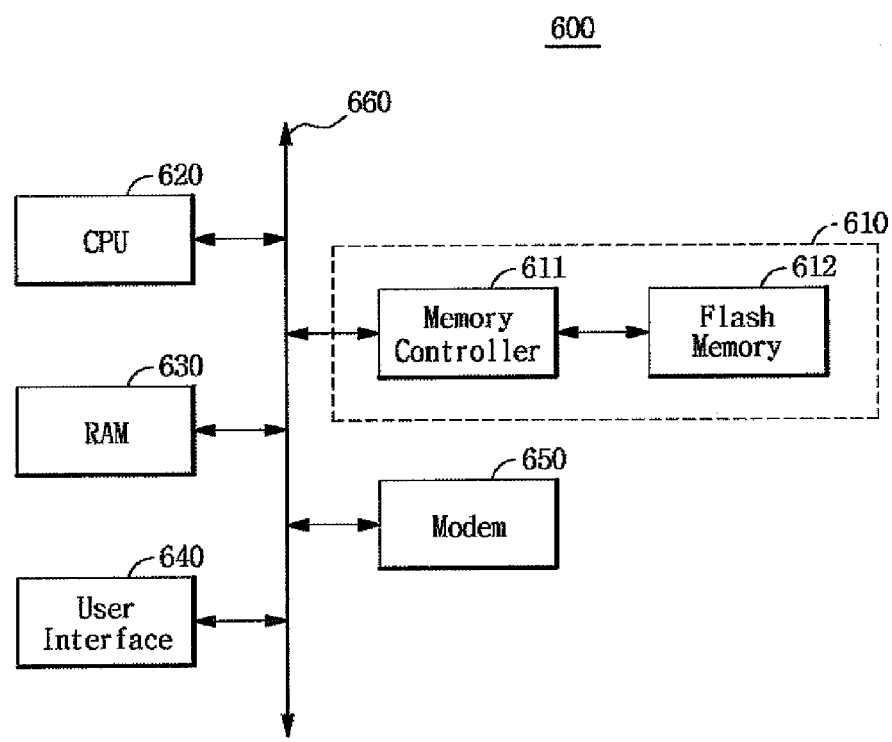
FIG. 18 is a block diagram of a data processing system including a semiconductor device manufactured according to the inventive concept.

FIG. 18 illustrates a data processing system 600 including a flash memory device 612. The data processing system 600 includes a microprocessor 620 electrically connected to a system bus 660, a RAM 630, a user interface 640, a modem 650 such as a baseband chipset and a memory system 610. The memory system 610 includes a memory controller 611 and a flash memory device 612. The flash memory device 612 is formed according to one of the embodiments described with reference to FIGS. 1 to 16. N-bit data (wherein N is an integer equal to or greater than 1) processed/to be processed by the microprocessor 620 may be stored in the flash memory device 612 through the memory controller 611.

When the data processing system is a mobile device, a battery (not shown) for supplying an operation voltage of the data processing system may be additionally provided.

Although not illustrated, the data processing system 600 may further include an application chipset, a camera image processor (CIS), and a mobile DRAM. Also, the memory controller 611 and the flash memory device 612 may constitute a solid-state drive/disk (SSD) having a non-volatile memory storing data.

The flash memory device and/or the memory controller formed by a method according to the inventive concept may be realized in the form of various types of semiconductor device packages. Such packages include Package on Packages (PoPs), Ball grid arrays (BGAs), Chip scale packages (CSPs), Plastic Leaded Chip Carriers (PLCCs), Plastic Dual In-Line Packages (PDIPs), Die in Waffle Packs, Die in Wafer Forms, Chip On Boards (COBs), Ceramic Dual In-Line Packages (CERDIPs), Plastic Metric Quad Flat Packs (MQFPs), Thin Quad Flatpacks (TQFPs), Small Outlines (SOICs), Shrink Small Outline Packages (SSOPs), Thin Small Outlines (TSOPs), Thin Quad Flatpacks (TQFPs), System In Packages (SIPs), Multi Chip Packages (MCPs), Wafer-level Fabricated Packages (WFPs), and Wafer-Level Processed Stack Packages (WSPs).

According to embodiments of the inventive concept as described above, features of a conductive pattern having different widths can be simultaneously formed, and a spacing of the conductive pattern features can be uniform. Also, cell gate lines in a cell array region of a flash memory device can be simultaneously formed with an alignment key of a photolithography process, a resistor of a peripheral circuit, a capacitor electrode or a gate electrode of a peripheral transistor.

Also, according to embodiments of the inventive concept as described above, a low-density sacrificial pattern is formed, and a high-density device pattern is formed using the low-density sacrificial pattern.

Finally, embodiments of the inventive concept have been described above in detail. The inventive concept may, however, be embodied in many different forms and should not be construed as being limited to the embodiments described above. Rather, these embodiments were described so that this disclosure is thorough and complete, and fully conveys the inventive concept to those skilled in the art. Thus, the true spirit and scope of the inventive concept is not limited by the embodiments described above but by the following claims.

What is claimed is:

1. A method of fabricating a semiconductor device, comprising:
   forming a conductive layer on a substrate;
   forming a mask layer on the conductive layer;
   forming first patterns spaced apart from each other and a second pattern on the mask layer, wherein the second pattern includes first and second linear portions parallel to each other;
   forming first auxiliary masks over ends of the first patterns, respectively, and forming a second auxiliary mask over and spanning the first and second portions of the second pattern, wherein sidewalls of the second auxiliary mask are disposed on the first and second portions of the second pattern, respectively;
   etching the mask layer using the first and second patterns and the first and second auxiliary masks as an etch mask to thereby form a first upper mask of first upper mask pattern features below the first patterns, respectively, and a second upper mask of a second upper mask pattern feature below the second pattern; and
   removing the first and second patterns and the first and second auxiliary masks, and
   etching the conductive layer using the first and second mask patterns as an etch mask to thereby form first conductive patterns below the first upper mask pattern features, respectively, and a second conductive pattern below the second upper mask pattern feature.

2. The method of claim 1, wherein the forming of first patterns spaced apart from each other and a second pattern on the mask layer comprises forming the first patterns and the second pattern such that the first and second linear portions of the second pattern have the same width as the first patterns.

3. The method of claim 1, comprising forming adjacent ones of the first conductive patterns as spaced apart from each other by a first distance, and forming the first conductive pattern adjacent to the second conductive pattern as spaced apart from the second conductive pattern by a distance substantially the same as the first distance.

4. The method of claim 1, wherein the forming of first patterns spaced apart from each other and a second pattern on the mask layer comprises:
   forming first and second sacrificial pattern features spaced apart from each other on the mask layer;
   forming a first spacer in the shape of a ring along sidewalls of the first sacrificial pattern feature so as to surround the first sacrificial pattern feature, and forming a second spacer along sidewalls of the second sacrificial pattern feature;
   removing ends of the first spacer to thereby form first spacer pattern features spaced apart from each other; and
   removing the first and second sacrificial pattern features after the first and second spacers or after the first spacer pattern features have been formed, wherein the first spacer pattern features constitute the first patterns spaced apart from each other on the mask layer, and the second spacer constitutes the second pattern on the mask layer.

5. A method of fabricating a semiconductor device, comprising:
   forming an underlying layer on a substrate;
   sequentially forming a mask layer and a sacrificial layer on the underlying layer;
   patterning the sacrificial layer to thereby form first sacrificial pattern features spaced apart from each other and at least one sacrificial pattern feature between two of the first sacrificial pattern features;

forming first and second spacers along sidewalls of the first and second sacrificial pattern features, respectively, so as to surround the first and second sacrificial pattern features;

removing the first and second sacrificial pattern features;

removing ends of the first spacers to thereby form spacer patterns spaced apart from each other;

forming first auxiliary masks over ends of the spacer patterns, respectively, and forming second auxiliary masks over at least parts of each of the second spacers, respectively;

etching the mask layer using the spacer patterns, the second spacers and the first and second auxiliary masks as an etch mask to thereby form first mask pattern features below the spacer patterns, respectively, and second mask pattern features below the second spacers, respectively;

removing the first and second auxiliary masks and the spacer patterns; and etching the underlying layer using the first and second mask patterns as an etch mask to thereby form first and second underlying patterns.

6. The method of claim 5, wherein the patterning of the sacrificial layer comprises forming first sacrificial patterns each having a first portion in the shape of a line, and an end contiguous to and having a width than greater than that of the first portion.

7. The method of claim 5, wherein the patterning of the sacrificial layer comprises forming second sacrificial patterns made up of a series of lines parallel to each other.

8. The method of claim 7, wherein the patterning of the sacrificial layer comprises forming first sacrificial patterns having linear portions parallel to and having the same width as the lines constituting the second sacrificial patterns.

9. The method of claim 7, wherein the lines have a set of corresponding first ends and a set of corresponding second ends, and the patterning of the sacrificial layer comprises forming second sacrificial patterns in which the corresponding ends of at least one of the first and second sets thereof are connected to each other.

10. The method of claim 5, wherein the patterning of the sacrificial layer comprises forming each of the second sacrificial patterns in the shape of a line having a width greater than that of each of the first sacrificial patterns.

11. The method of claim 5, wherein the forming of the second spacers comprises forming second spacers each having first and second portions that are parallel to the spacer patterns when the ends of the first spacers are removed, the forming of the second auxiliary masks comprises forming second auxiliary masks that each span the first and second portions of a respective one of the second spacers such that sidewalls of each of the second auxiliary masks are disposed on the first and second portions, respectively, of a respective one of the second spacers.

12. The method of claim 5, comprising forming the first underlying patterns to each include an interconnection region having a first width and a pad region provided at one end of the first underlying pattern and having a greater width than the interconnection region, and forming the second underlying patterns to each have a second width greater than the first width.

13. The method of claim 5, comprising forming the first underlying patterns adjacent to each other as spaced apart by a first distance, and forming each of the first underlying patterns adjacent to a respective one of the second underlying patterns as spaced therefrom by the first distance.

14. The method of claim 5, comprising forming each of the first underlying patterns adjacent to a respective one of the second underlying patterns as spaced therefrom by a first distance, and forming the second underlying patterns adjacent to each other as apart by a second distance greater than the first distance.

15. The method of claim 5, wherein the forming of the first and second mask patterns comprises:

forming the mask layer to include a lower mask layer and an upper mask layer of different materials, wherein the upper mask layer is stacked on the lower mask layer;

etching the upper mask layer using the spacer patterns, the second spacers and the first and second auxiliary masks as an etch mask to thereby form upper mask pattern features; and etching the lower mask layer to thereby form lower mask pattern features.

16. The method of claim 15, comprising removing the auxiliary masks while the upper mask pattern features are formed, removing the spacer patterns and the second spacers while the lower mask pattern features are formed, and removing the upper mask patterns while the underlying patterns are formed.

17. The method of claim 5, wherein the removing of the ends of the first spacers is carried out by photolithography and etching processes, and further comprising removing ends of the second spacers using said photolithography and etching processes.

18. The method of claim 5, further comprising:

forming a peripheral mask while the auxiliary masks are formed;

etching the mask layer using the peripheral mask as an etch mask to thereby form a peripheral mask pattern while the mask pattern features are formed;

removing the peripheral mask while the auxiliary masks are removed; and etching the underlying layer using the peripheral mask pattern as an etch mask to thereby form a peripheral pattern while the first and second underlying patterns are formed.

19. The method of claim 18, wherein the first underlying patterns are cell gate lines in a cell array region of a memory device, the second underlying patterns are selection gate lines, and the peripheral pattern is one of a photo-lithography process alignment key, a resistor, a capacitor electrode and a gate electrode of a peripheral transistor.

20. A method of fabricating a semiconductor device, comprising:

forming an underlying layer on a substrate;

forming a first mask layer on the underlying layer and a second mask layer on the first mask layer;

forming first spacer patterns spaced apart a first distance on the second mask layer, and forming a second spacer pattern spaced apart by the first distance from adjacent ones of the first spacer patterns, wherein the second spacer pattern has first and second portions parallel to each other;

etching the second mask layer in such a way as to expose a predetermined region of the first mask layer to thereby form first upper mask pattern features below the first spacer patterns, and second upper mask pattern features below the second spacer pattern, form a sidewall of each second upper mask pattern that faces away from the first upper mask pattern adjacent thereto to be more inclined, with respect to the vertical, than sidewalls of the second upper mask pattern features which face toward first upper mask patterns, and form the sidewall of each second upper mask pattern feature that faces toward the first upper mask patterns adjacent thereto to have substantially the same gradient as the sidewalls of the first upper mask patterns;

forming first auxiliary masks over ends of the first spacer patterns, respectively, and forming a second auxiliary mask over the region of the first mask layer exposed between the first and second portions of the second spacer pattern;

etching the first mask layer using the first and second spacer patterns, the first and second upper mask pattern features, and the first and second auxiliary masks as an etch mask to thereby form lower mask pattern features;

removing the first and second spacer patterns, and the first and second auxiliary masks; and etching the underlying layer to thereby form underlying patterns, wherein the first and second upper mask pattern features are removed while the underlying patterns are formed.

* * * * *